(12) United States Patent
Shinohara

(10) Patent No.: US 12,011,743 B2
(45) Date of Patent: Jun. 18, 2024

(54) LOWER-SURFACE BRUSH, BRUSH BASE AND SUBSTRATE CLEANING DEVICE

(71) Applicant: SCREEN HOLDINGS CO., LTD., Kyoto (JP)

(72) Inventor: Takashi Shinohara, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 175 days.

(21) Appl. No.: 17/526,026

(22) Filed: Nov. 15, 2021

(65) Prior Publication Data

US 2022/0161299 A1 May 26, 2022

(30) Foreign Application Priority Data

Nov. 26, 2020 (JP) ................................. 2020-196045

(51) Int. Cl.
| | | |
|---|---|---|
| *B08B 1/12* | (2024.01) | |
| *A46B 13/00* | (2006.01) | |
| *A46B 13/02* | (2006.01) | |
| *B08B 1/20* | (2024.01) | |

(52) U.S. Cl.
CPC .............. *B08B 1/12* (2024.01); *A46B 13/008* (2013.01); *A46B 13/02* (2013.01); *B08B 1/20* (2024.01); *A46B 2200/3073* (2013.01)

(58) Field of Classification Search
CPC .... B60S 1/002; B60S 1/02; B60S 3/04; A46B 13/008
See application file for complete search history.

(56) References Cited

U.S. PATENT DOCUMENTS

| | | | |
|---|---|---|---|
| 2012/0014689 A1 | 1/2012 | Ookouchi et al. ............ | 396/611 |
| 2013/0258300 A1 | 10/2013 | Nishiyama | |
| 2016/0059380 A1 | 3/2016 | Yamaguchi et al. | |
| 2016/0126113 A1 | 5/2016 | Ishibashi | |
| 2017/0221696 A1 | 8/2017 | Nishiyama | |

(Continued)

FOREIGN PATENT DOCUMENTS

| | | |
|---|---|---|
| JP | 2001-104893 A | 4/2001 |
| JP | 2010-016098 A | 1/2010 |

(Continued)

OTHER PUBLICATIONS

Office Action dated Mar. 16, 2023 in corresponding Taiwanese Patent Application No. 110140340.

(Continued)

*Primary Examiner* — Andrew A Horton
(74) *Attorney, Agent, or Firm* — OSTROLENK FABER LLP

(57) ABSTRACT

A lower-surface brush includes a base portion, a first cleaning portion and a second cleaning portion. The first cleaning portion is provided on an upper surface of the base portion to project upwardly from the upper surface of the base portion and extend in one direction through a geometric center of the base portion in a plan view. The second cleaning portion is provided on the upper surface of the base portion to project upwardly from the upper surface of the base portion and extend along an outer edge of the base portion. Alternatively, one or a plurality of pairs of second cleaning portions may be provided on the upper surface of the base portion to project upwardly from the upper surface of the base portion and be opposite to each other with the first cleaning portion interposed therebetween.

11 Claims, 20 Drawing Sheets

(56) References Cited

U.S. PATENT DOCUMENTS

| | | |
|---|---|---|
| 2017/0252895 A1 | 9/2017 | Yamaguchi et al. |
| 2019/0118338 A1 | 4/2019 | Yamaguchi et al. |
| 2019/0214245 A1 | 7/2019 | Nishiyama |
| 2020/0030855 A1 | 1/2020 | Ishibashi |
| 2021/0210338 A1 | 7/2021 | Nishiyama |

FOREIGN PATENT DOCUMENTS

| | | |
|---|---|---|
| JP | 2012-023209 A | 2/2012 |
| JP | 2017-139442 A | 8/2017 |
| JP | 2020-155617 A | 9/2020 |
| JP | 2020-167438 A | 10/2020 |
| KR | 10-2010-0119169 A | 11/2010 |
| KR | 10-2012-0007452 A | 1/2012 |
| KR | 10-2016-0052343 A | 5/2016 |
| TW | 201351490 A | 12/2013 |
| TW | 201608663 A | 3/2016 |
| TW | 202036670 A | 10/2020 |

OTHER PUBLICATIONS

Corrected Search Report dated Apr. 11, 2023, issued in the counterpart Taiwanese Patent Application No. 110140340.

Office Action dated Aug. 18, 2023, issued in corresponding Korean Patent Application No. 10-2021-0165609.

Japanese Notice of Reasons for Refusal, mailed Apr. 23, 2024, issued in corresponding Japanese Patent Application No. 2020-196045, with English translation.

FIG. 14
PLAN VIEW
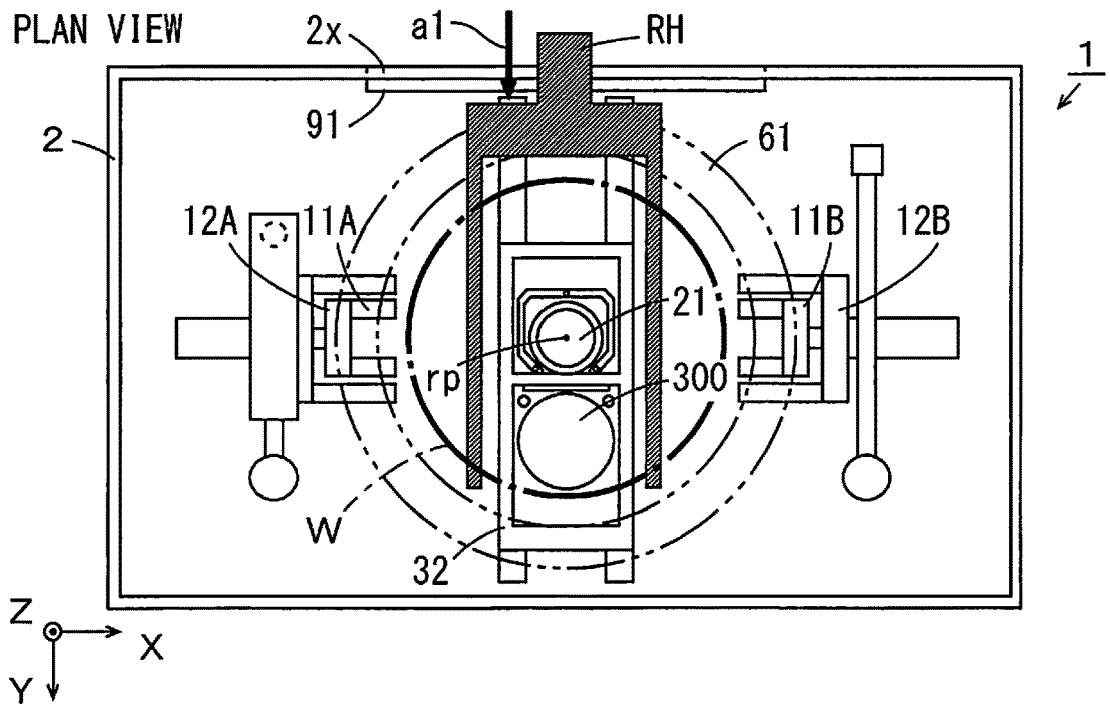
SIDE VIEW OF SUBSTRATE CLEANING
DEVICE TAKEN ALONG LINE A-A
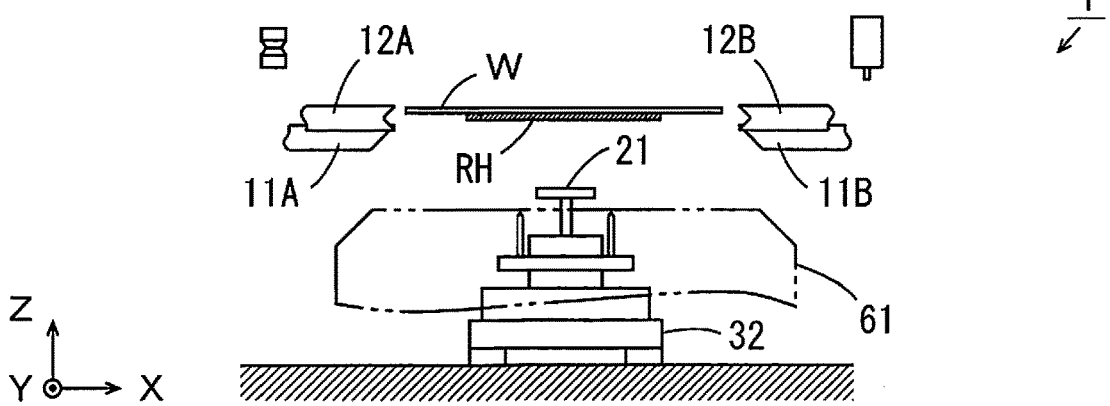
SIDE VIEW OF SUBSTRATE CLEANING
DEVICE TAKEN ALONG LINE B-B
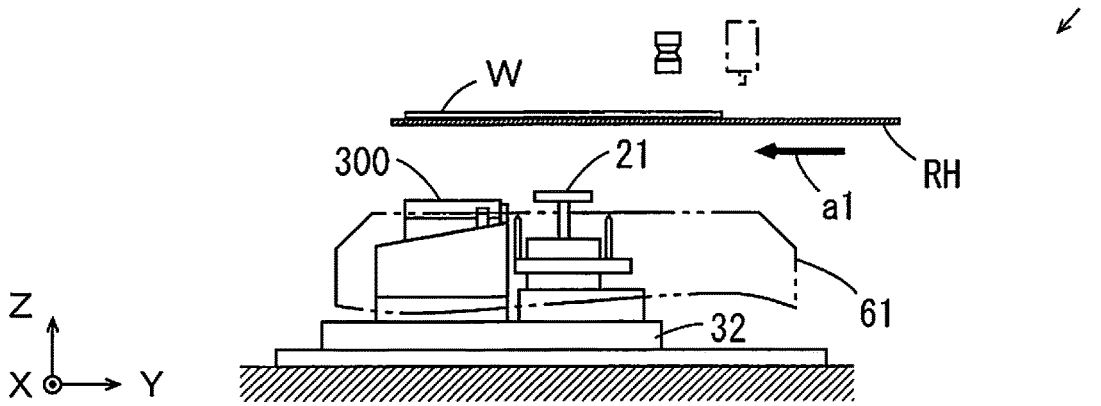

FIG. 15
PLAN VIEW
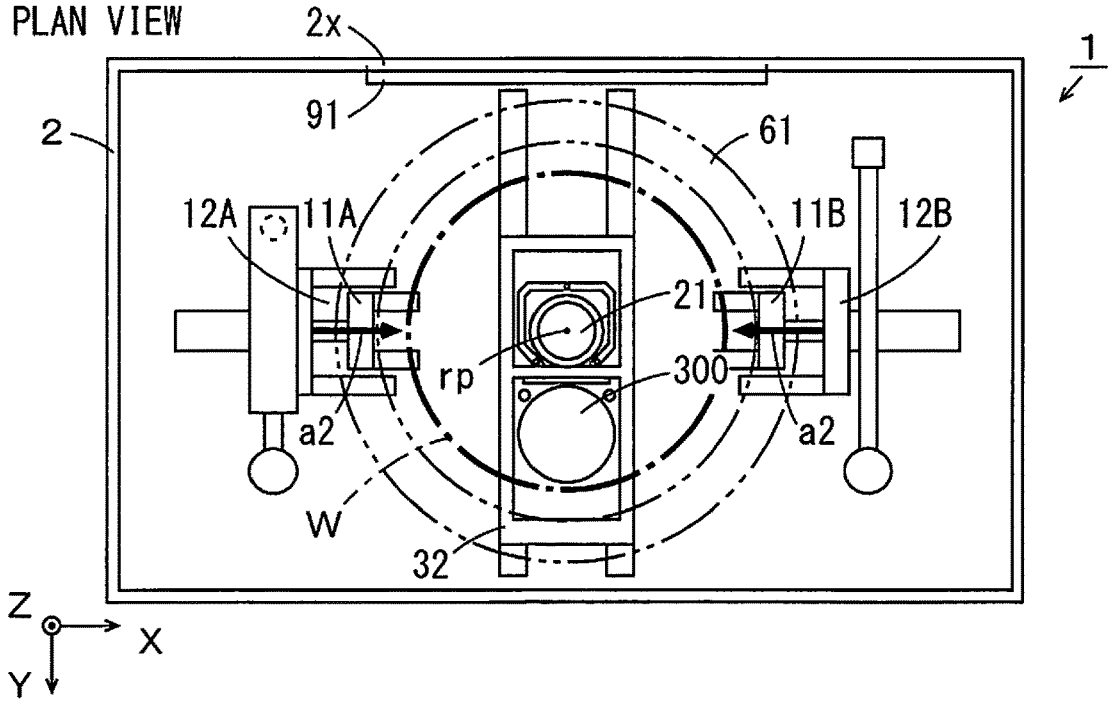
SIDE VIEW OF SUBSTRATE CLEANING
DEVICE TAKEN ALONG LINE A-A
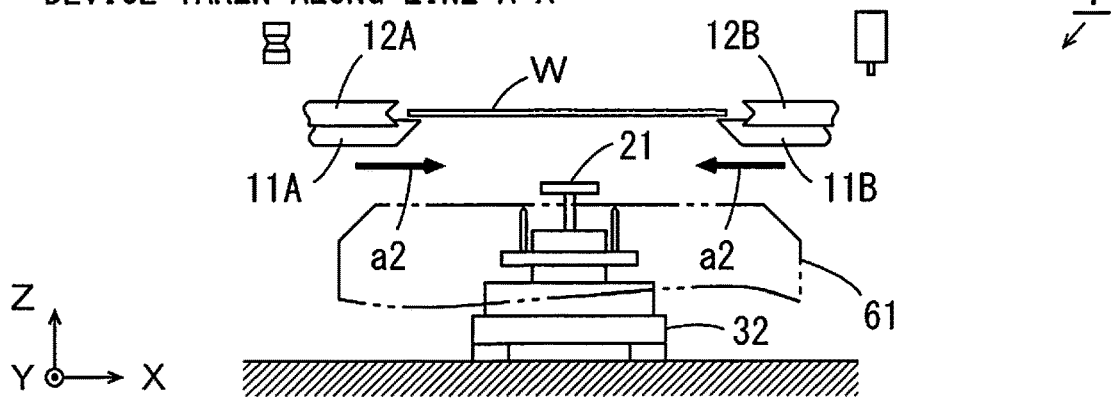
SIDE VIEW OF SUBSTRATE CLEANING
DEVICE TAKEN ALONG LINE B-B
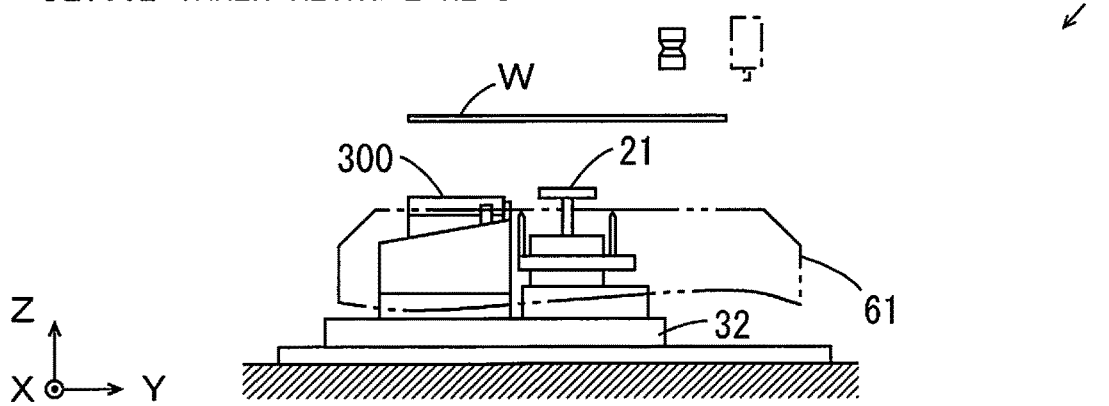

FIG. 16
PLAN VIEW
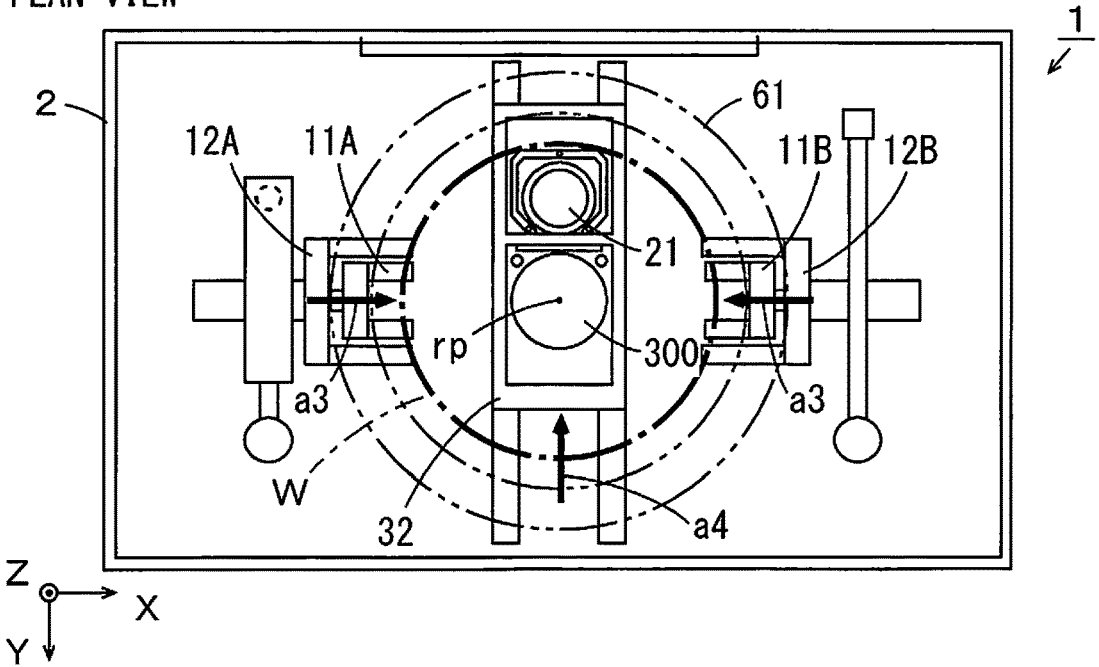
SIDE VIEW OF SUBSTRATE CLEANING DEVICE TAKEN ALONG LINE A-A
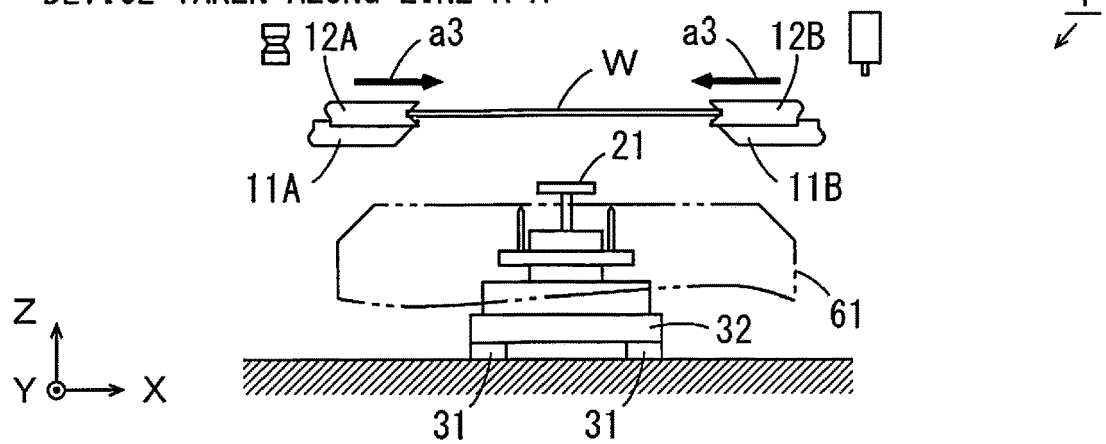
SIDE VIEW OF SUBSTRATE CLEANING DEVICE TAKEN ALONG LINE B-B
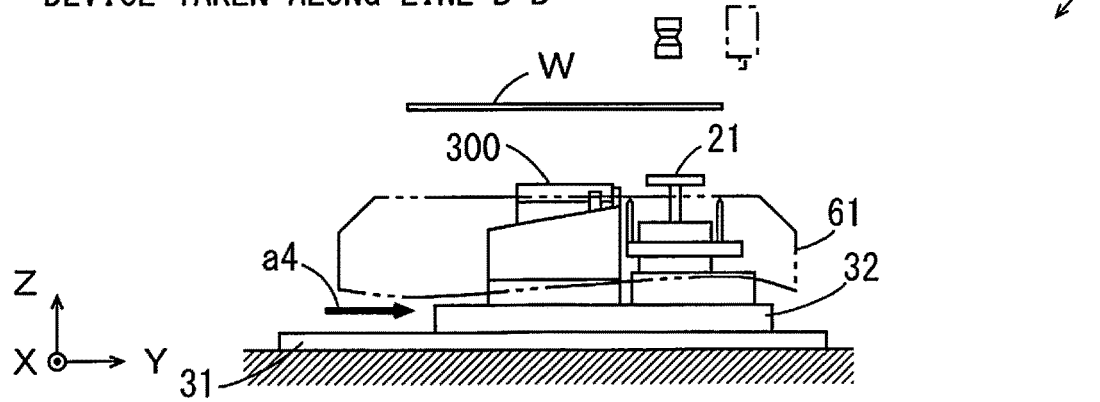

FIG. 17
PLAN VIEW
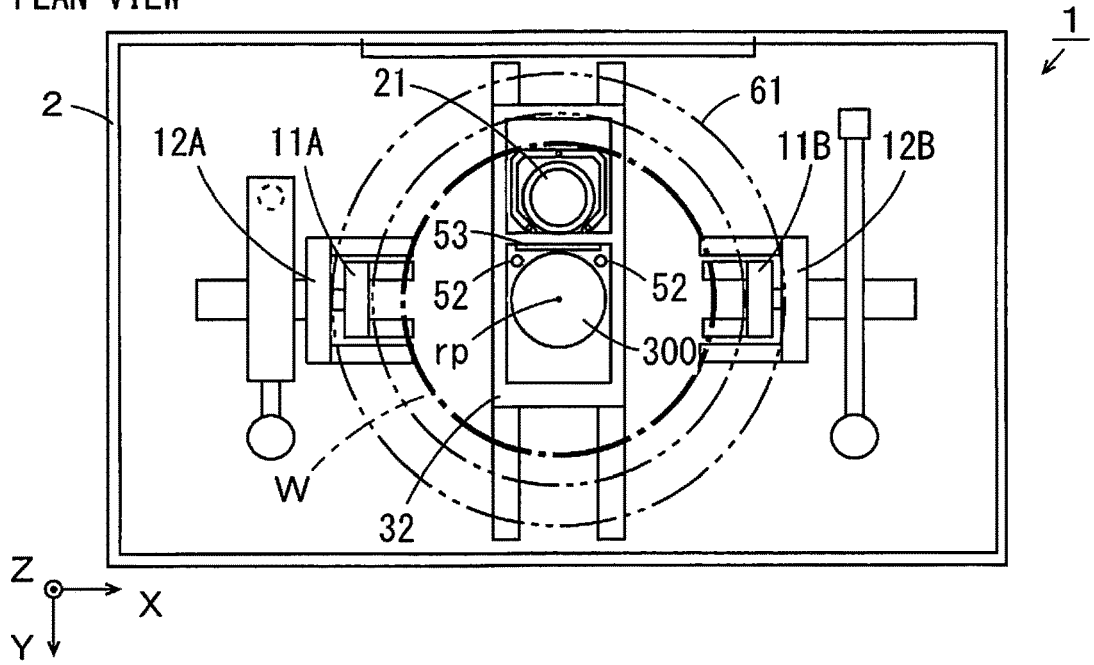
SIDE VIEW OF SUBSTRATE CLEANING DEVICE TAKEN ALONG LINE A-A
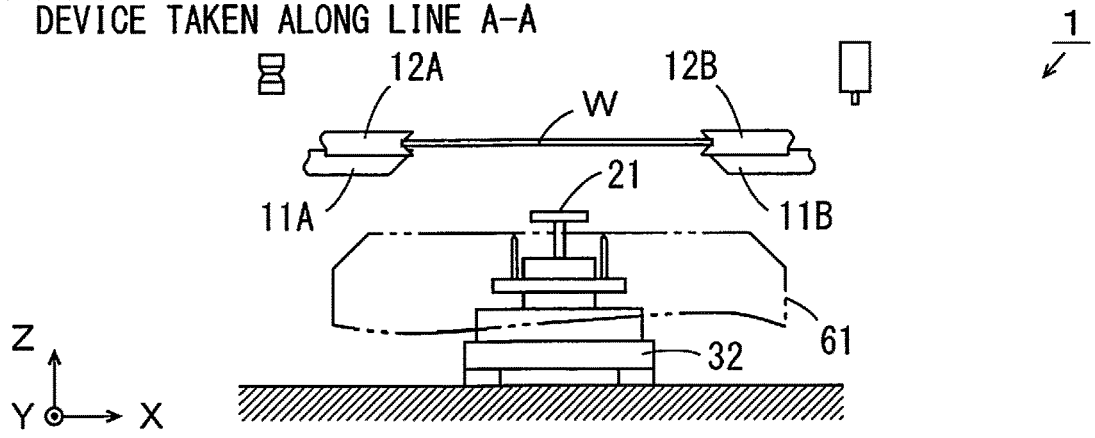
SIDE VIEW OF SUBSTRATE CLEANING DEVICE TAKEN ALONG LINE B-B
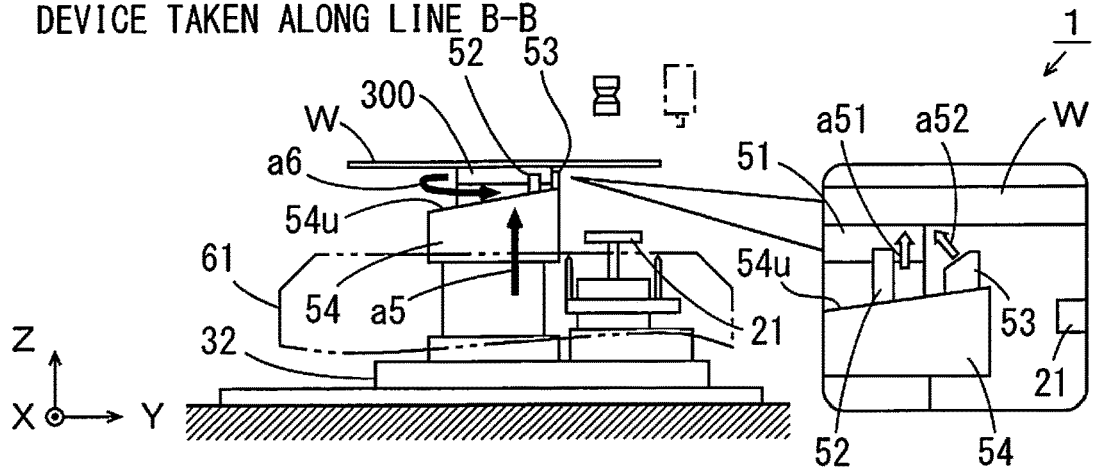

FIG. 18
PLAN VIEW
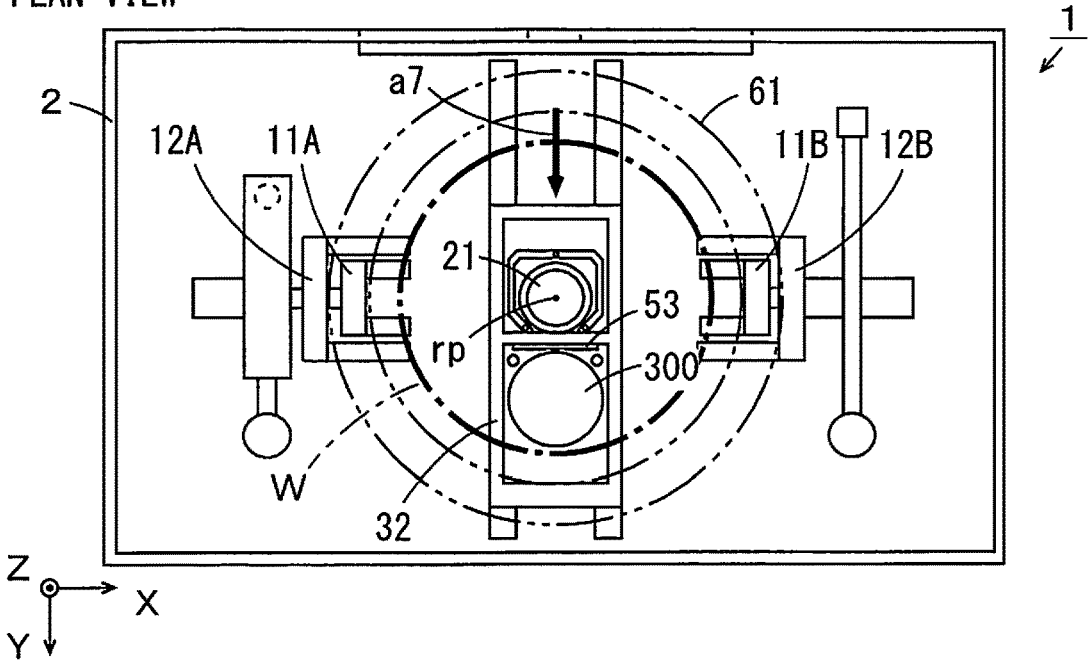
SIDE VIEW OF SUBSTRATE CLEANING
DEVICE TAKEN ALONG LINE A-A
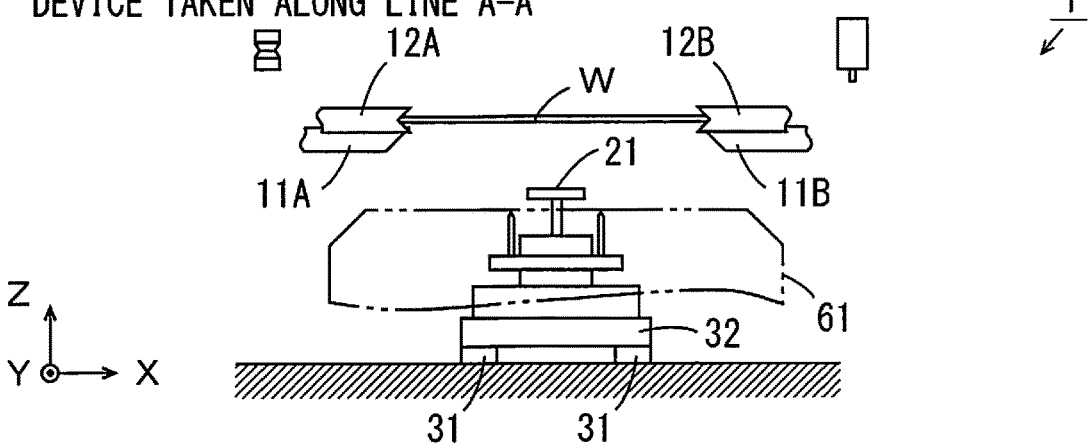
SIDE VIEW OF SUBSTRATE CLEANING
DEVICE TAKEN ALONG LINE B-B
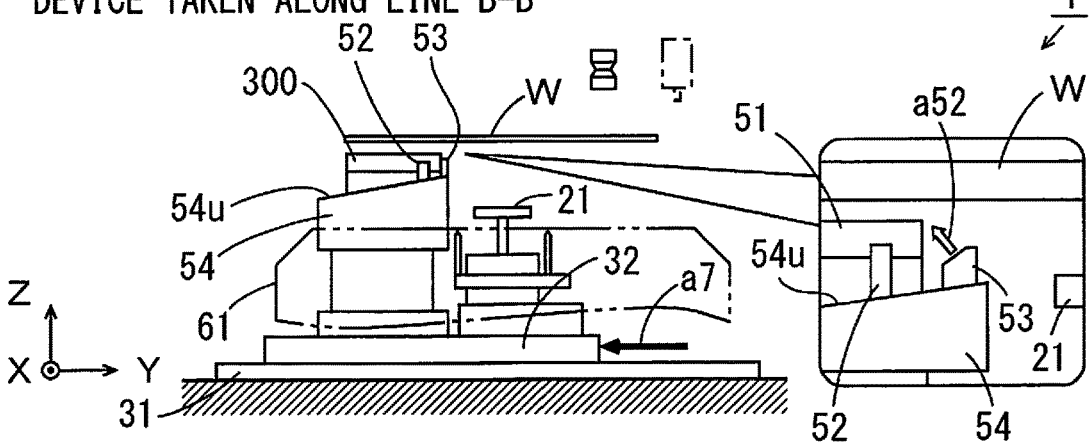

FIG. 19
PLAN VIEW
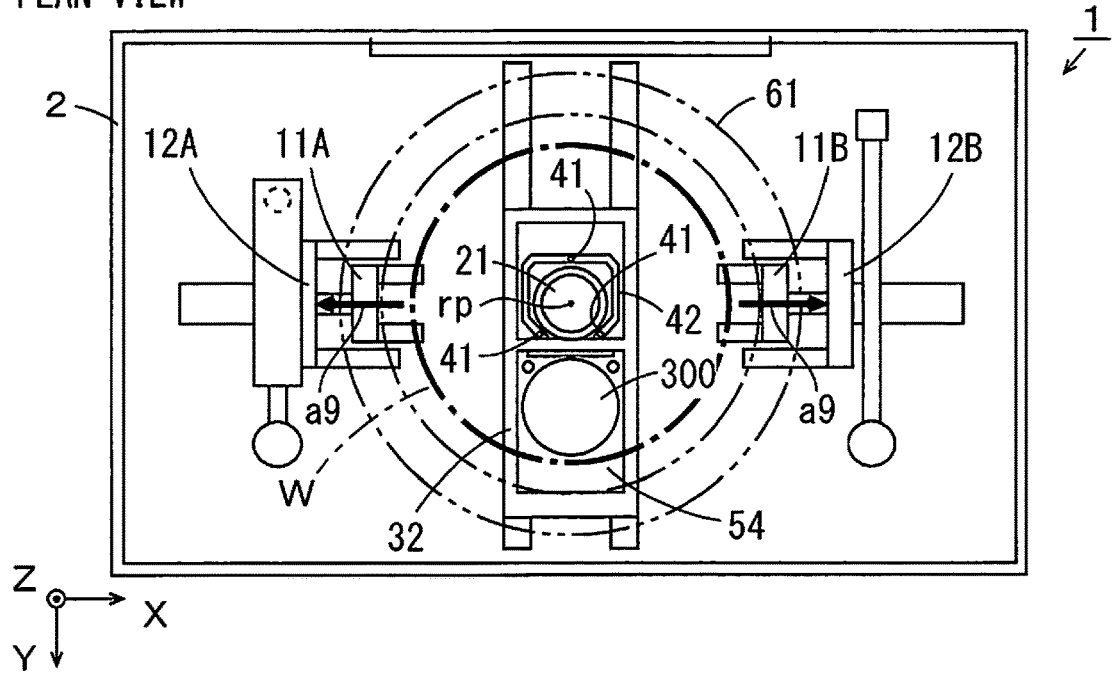
SIDE VIEW OF SUBSTRATE CLEANING
DEVICE TAKEN ALONG LINE A-A
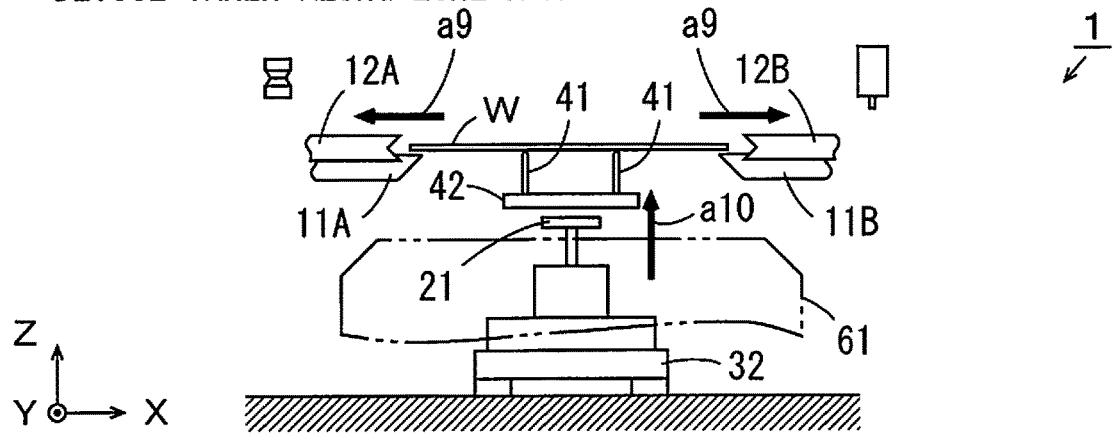
SIDE VIEW OF SUBSTRATE CLEANING
DEVICE TAKEN ALONG LINE B-B
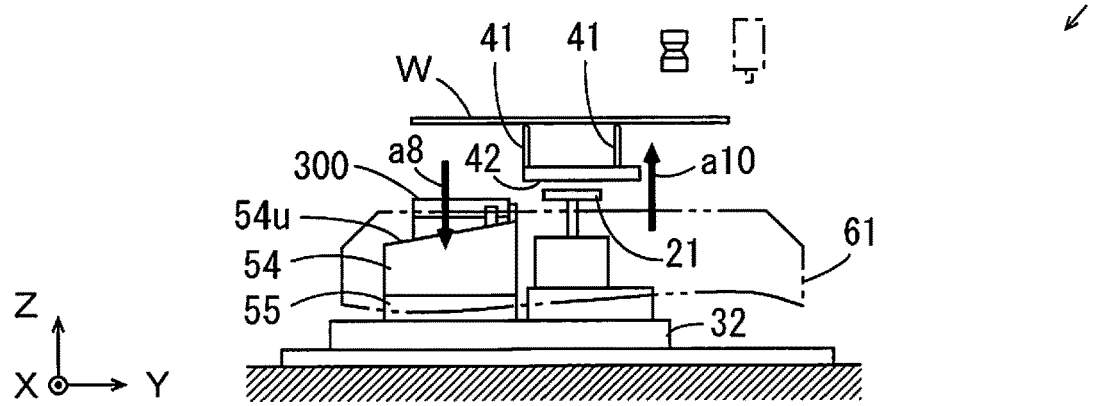

FIG. 20
PLAN VIEW
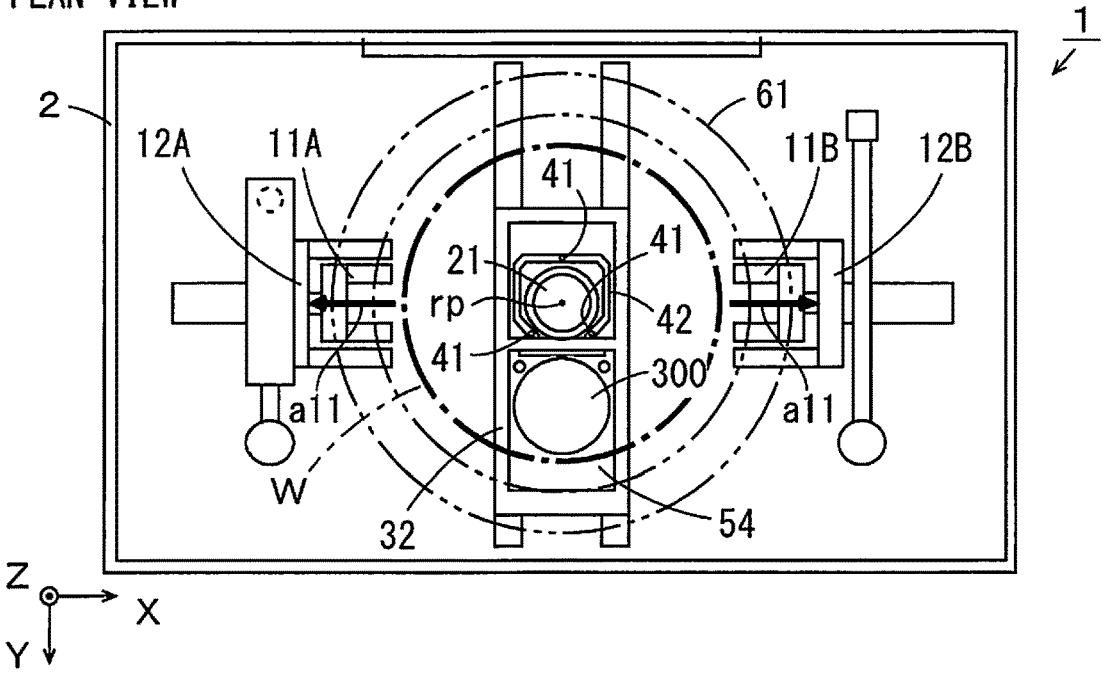
SIDE VIEW OF SUBSTRATE CLEANING
DEVICE TAKEN ALONG LINE A-A
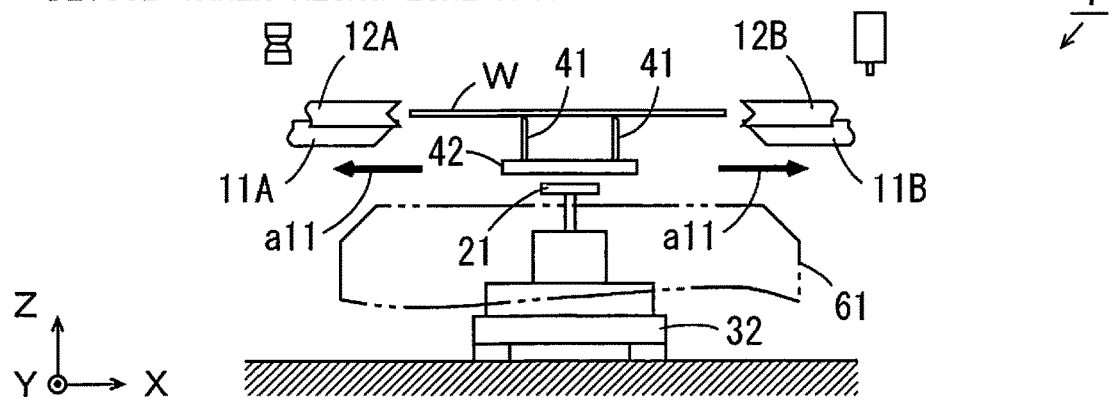
SIDE VIEW OF SUBSTRATE CLEANING
DEVICE TAKEN ALONG LINE B-B
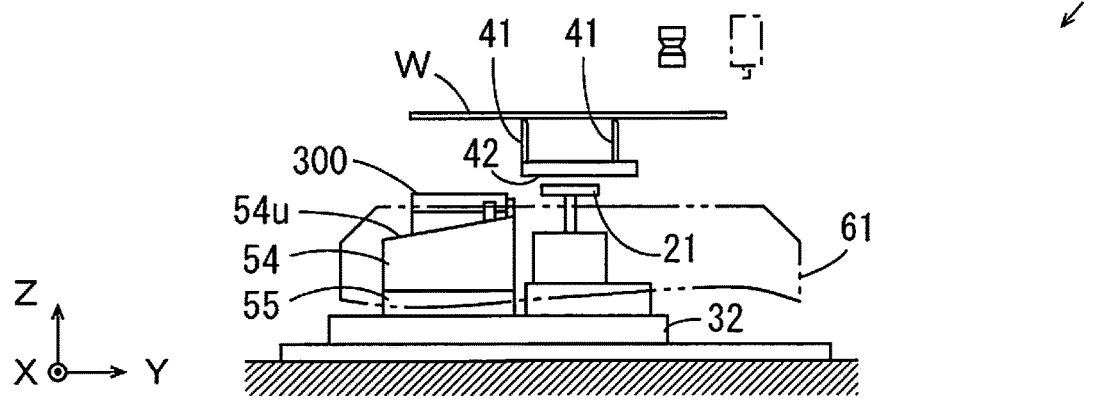

FIG. 21
PLAN VIEW
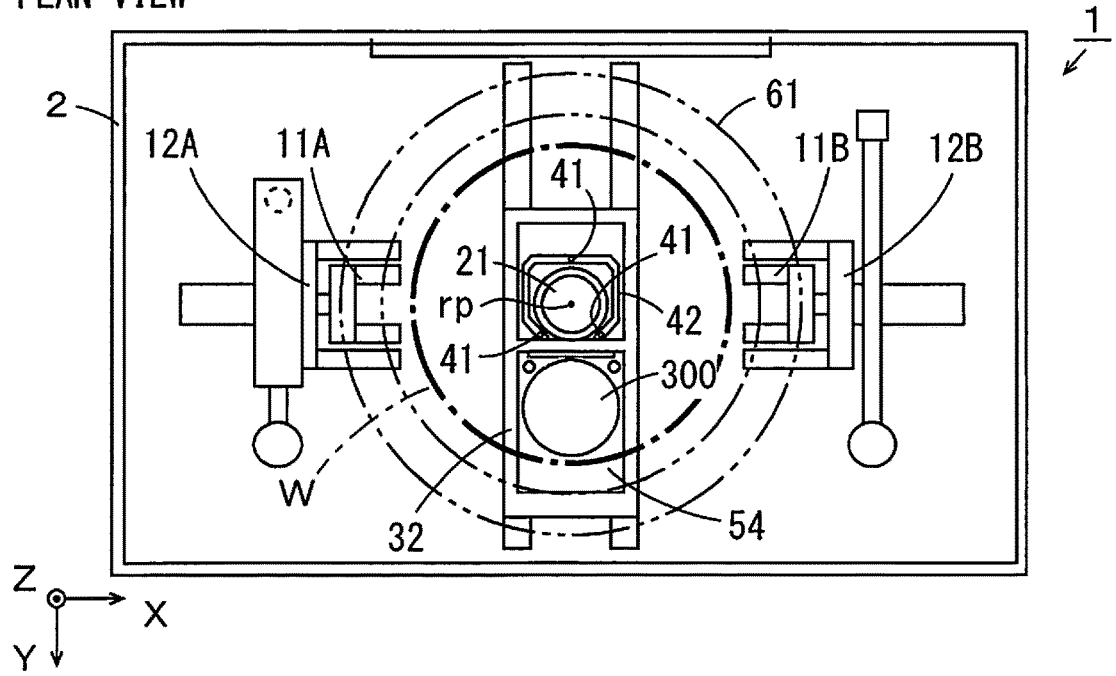
SIDE VIEW OF SUBSTRATE CLEANING
DEVICE TAKEN ALONG LINE A-A
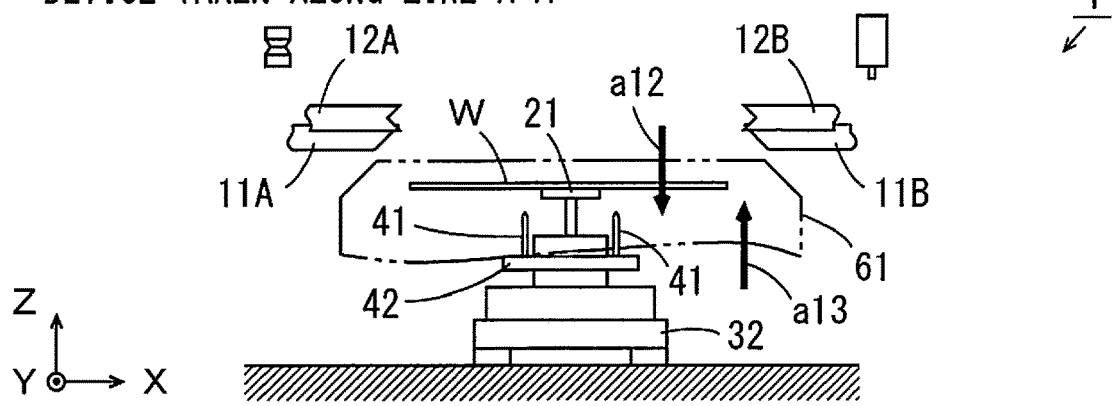
SIDE VIEW OF SUBSTRATE CLEANING
DEVICE TAKEN ALONG LINE B-B
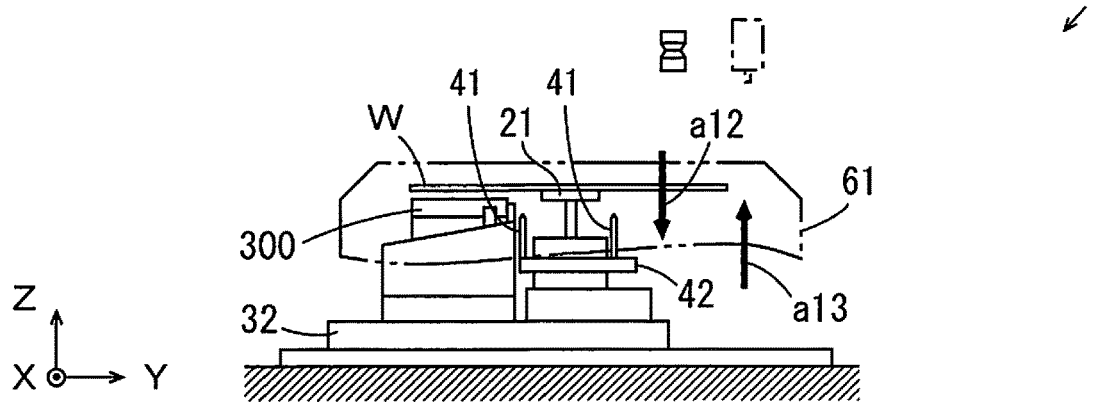

FIG. 22
PLAN VIEW
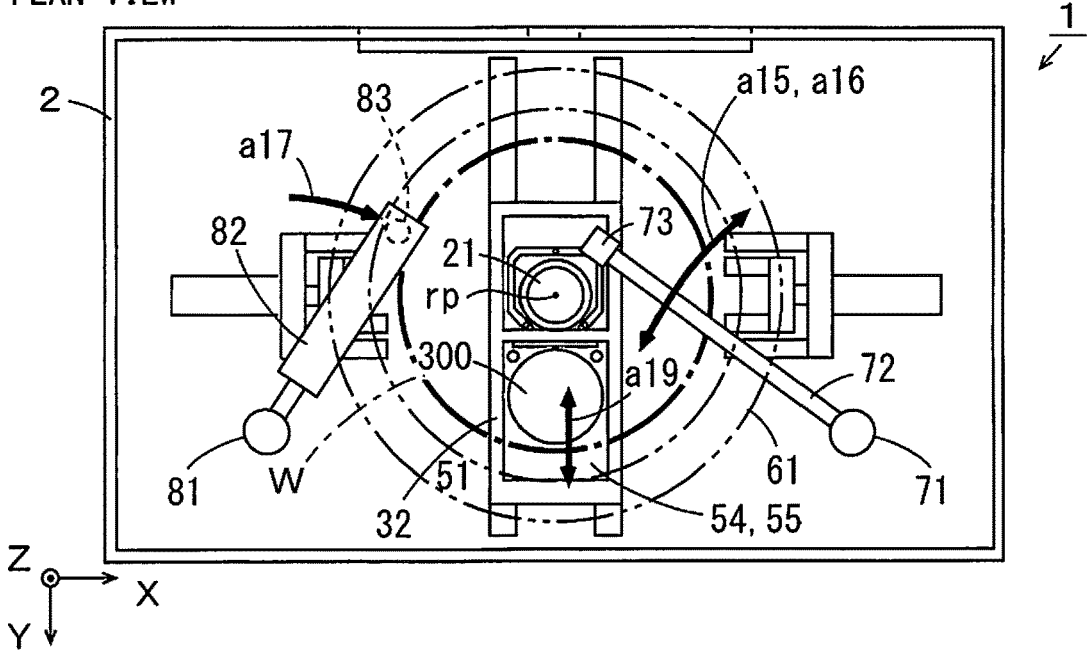
SIDE VIEW OF SUBSTRATE CLEANING
DEVICE TAKEN ALONG LINE A-A
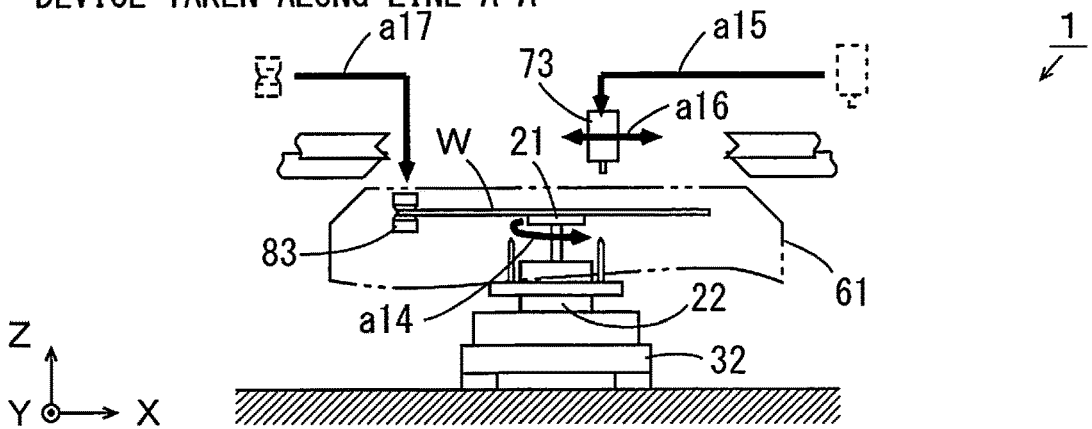
SIDE VIEW OF SUBSTRATE CLEANING
DEVICE TAKEN ALONG LINE B-B
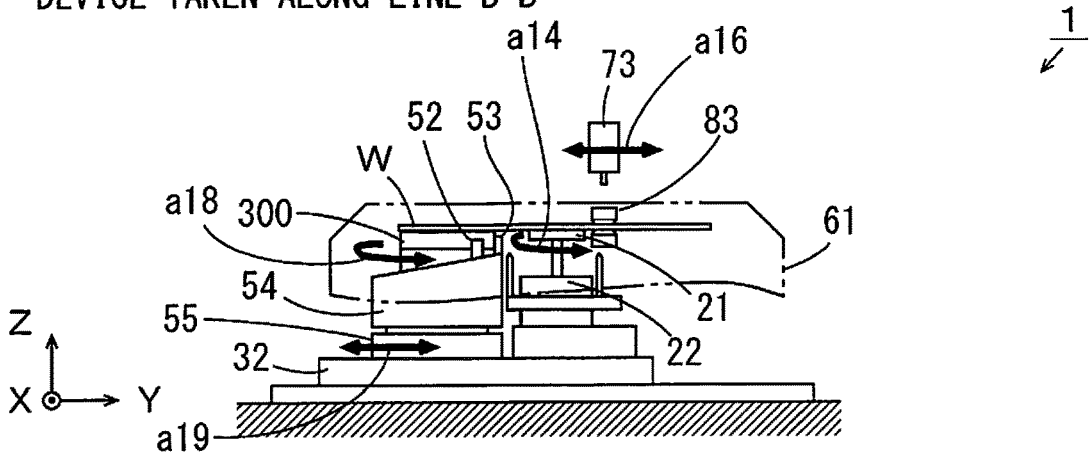

FIG. 23
PLAN VIEW
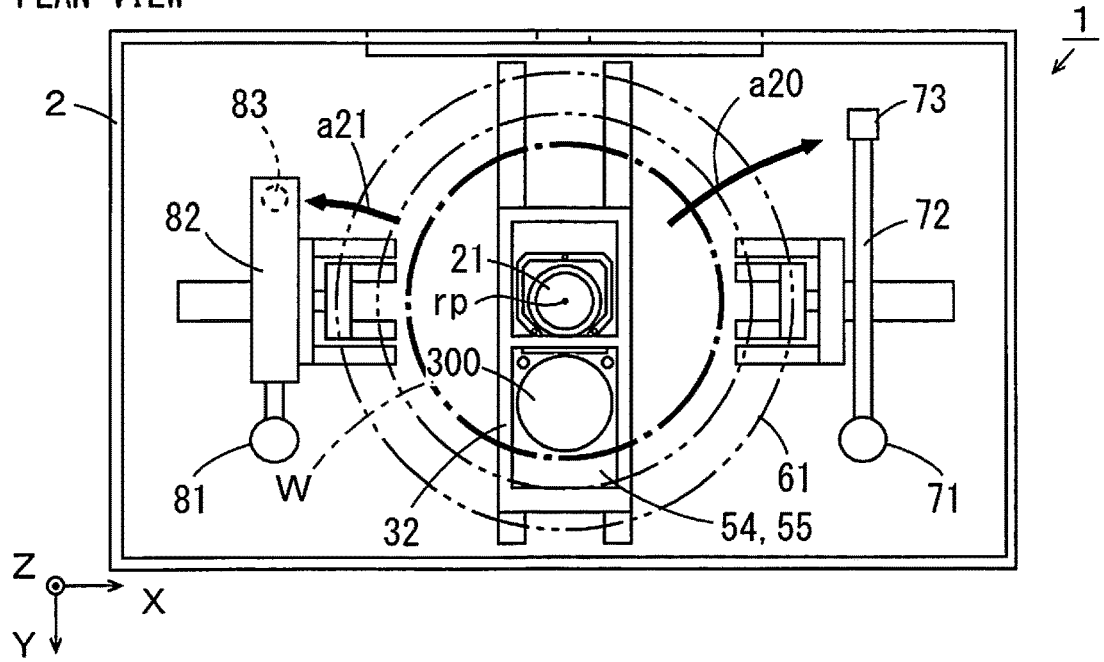
SIDE VIEW OF SUBSTRATE CLEANING
DEVICE TAKEN ALONG LINE A-A
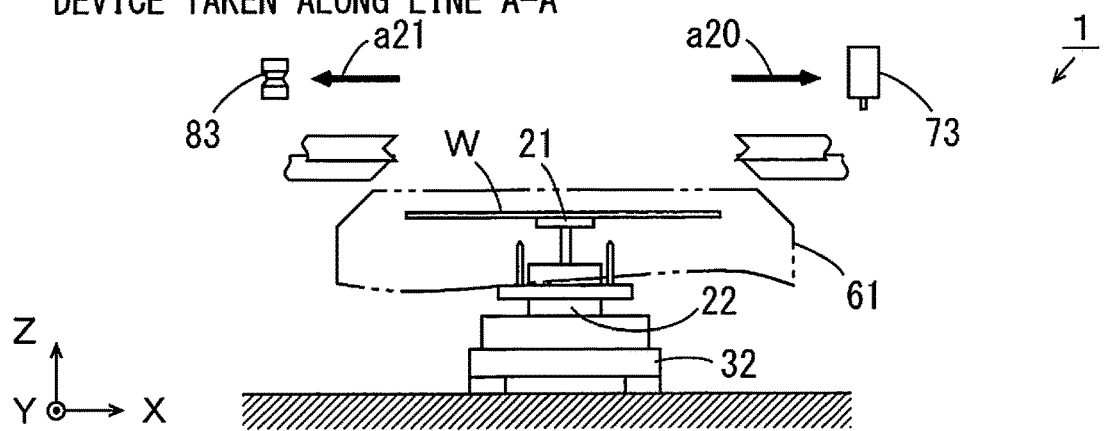
SIDE VIEW OF SUBSTRATE CLEANING
DEVICE TAKEN ALONG LINE B-B
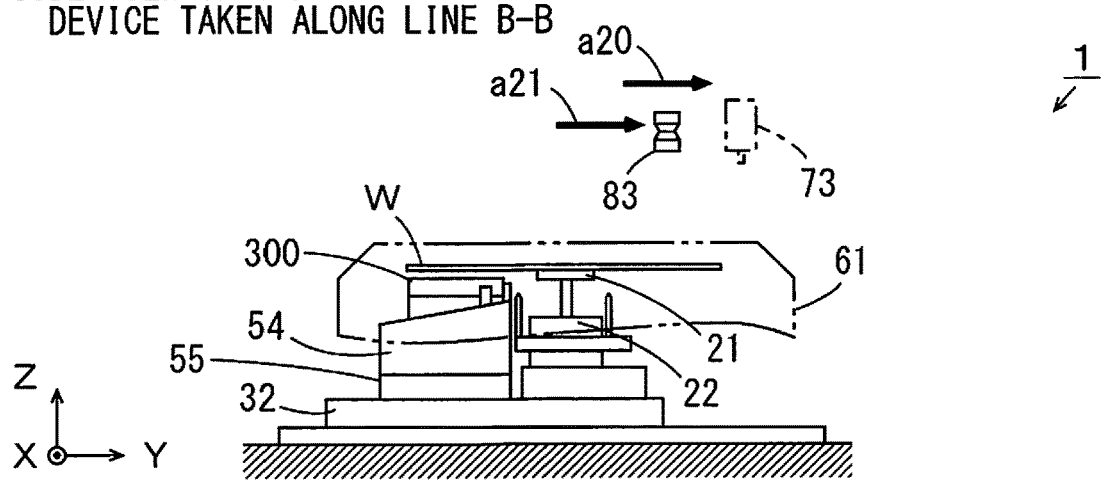

FIG. 24
PLAN VIEW
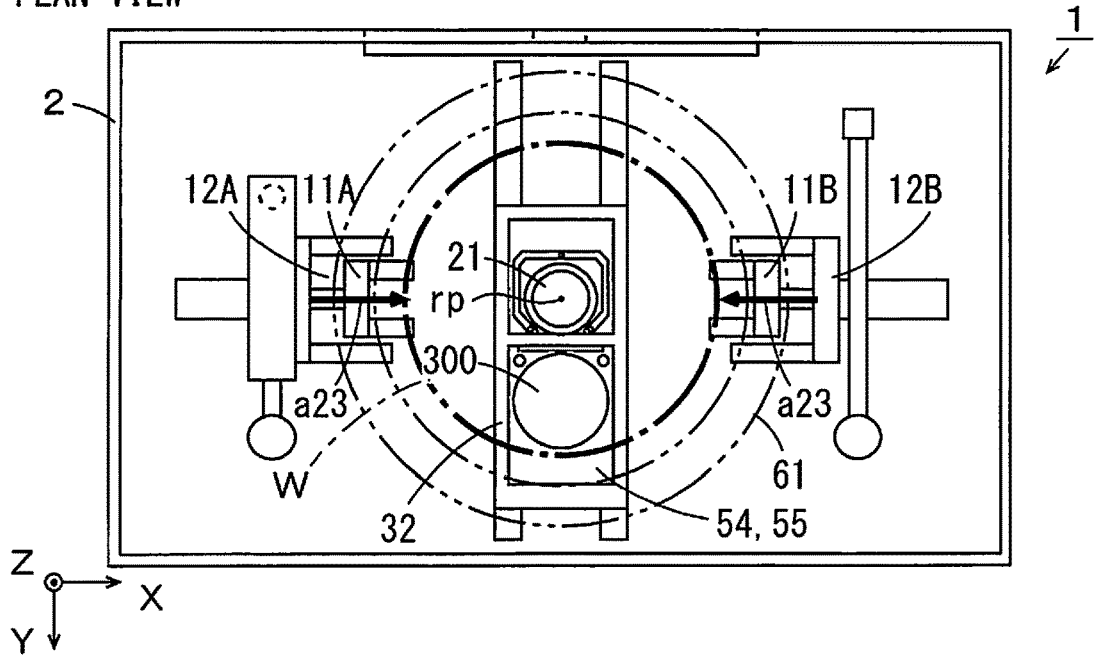
SIDE VIEW OF SUBSTRATE CLEANING
DEVICE TAKEN ALONG LINE A-A
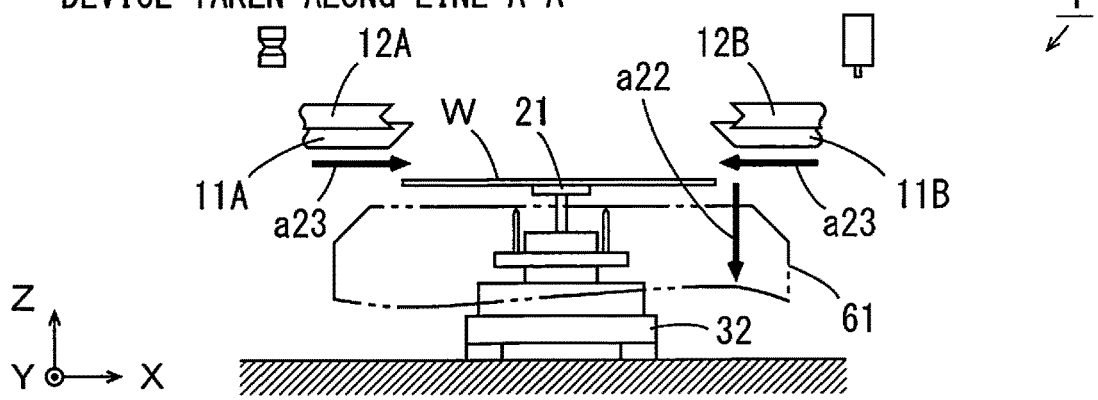
SIDE VIEW OF SUBSTRATE CLEANING
DEVICE TAKEN ALONG LINE B-B
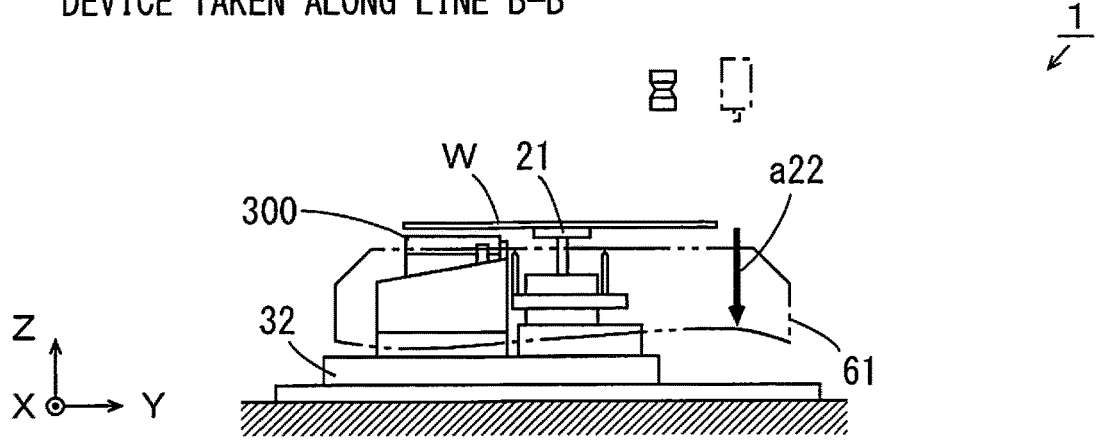

LOWER-SURFACE BRUSH, BRUSH BASE AND SUBSTRATE CLEANING DEVICE

BACKGROUND

Technical Field

The present invention relates to a lower-surface brush, a brush base and a substrate cleaning device for cleaning a lower surface of a substrate.

Description of Related Art

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

In a substrate cleaning device described in JP 2017-139442 A, for example, an outer peripheral end of the substrate is held with a plurality of chuck pins provided at a spin plate abutting against a plurality of portions of the outer peripheral end of the substrate, and the spin plate is rotated about a rotation axis. Further, the upper surface of a cleaning brush having a substantially columnar shape comes into contact with the back surface of the rotating substrate. In this state, the cleaning brush is moved between the center portion and the peripheral portion of the back surface of the substrate, whereby the entire back surface of the substrate is cleaned, and contaminants adhering to the back surface of the substrate are removed.

SUMMARY

In the substrate cleaning device, in a case where the diameter of the cleaning brush is small, the throughput is reduced. However, in a case where the diameter of the cleaning brush is increased, the contact area between the cleaning brush and a substrate is increased. In this case, a load applied to the cleaning brush per unit area is reduced, so that efficiency of contaminants removal is degraded. On the other hand, in a case where a load applied to the cleaning brush is increased, warp of a substrate may occur. Thus, efficiency of contaminant removal is degraded. Further, when a load applied to the cleaning brush is increased, a substrate moves out of a holder such as a chuck pin.

An object of the present invention is to provide a lower-surface brush, a brush base and a substrate cleaning device that can efficiently clean a lower surface of a substrate.

(1) A lower-surface brush according to one aspect of the present invention is used to clean a lower surface of a substrate, and includes a base portion having a first upper surface, a first cleaning portion that is provided on the first upper surface of the base portion to project upwardly from the first upper surface of the base portion and extend in one direction through a geometric center of the base portion in a plan view, and a second cleaning portion provided on the first upper surface of the base portion to project upwardly from the first upper surface of the base portion and extend along an outer edge of the base portion.

In this lower-surface brush, the contact area between the lower surface of the substrate and the lower-surface brush is reduced while a large region that can be used for cleaning is maintained. Therefore, even in a case where a load applied to the lower-surface brush is relatively small, the lower surface of the substrate and the lower-surface brush come into contact with each other while receiving a sufficient load. Thus, the lower surface of the substrate can be cleaned efficiently.

(2) A lower-surface brush according to another aspect of the present invention is used to clean a lower surface of a substrate, and includes a base portion having a first upper surface, a first cleaning portion provided on the first upper surface of the base portion to project upwardly from the first upper surface of the base portion and extend in one direction through a geometric center of the base portion in a plan view, and one or a plurality of pairs of second cleaning portions provided on the first upper surface of the base portion to project upwardly from the first upper surface of the base portion and be opposite to each other with the first cleaning portion interposed therebetween.

In this lower-surface brush, the contact area between the lower surface of the substrate and the lower-surface brush is reduced while a large region that can be used for cleaning is maintained. Therefore, even in a case where a load applied to the lower-surface brush is relatively small, the lower surface of the substrate and the lower-surface brush come into contact with each other while receiving a sufficient load. Thus, the lower surface of the substrate can be cleaned efficiently.

(3) A through hole through which liquid is dischargeable may be formed in the base portion to extend in an up-and-down direction. With this configuration, in a case where being used when the lower surface of the substrate is cleaned, a cleaning liquid is discharged through the through hole without staying on the lower-surface brush. Thus, the lower surface of the substrate can be cleaned more efficiently with use of the cleaning liquid.

(4) The lower-surface brush may be configured such that liquid is dischargeable outwardly from a peripheral edge of the base portion through spaces between the first cleaning portion and the second cleaning portion. With this configuration, in a case where being used when the lower surface of the substrate is cleaned, a cleaning liquid is discharged through the spaces between the first cleaning portion and the second cleaning portion without staying on the lower-surface brush. Thus, the lower surface of the substrate can be cleaned more efficiently with use of the cleaning liquid.

(5) The base portion may have an outer shape that is circular, oblong or oval in a plan view, and the first cleaning portion may be provided to extend between two points that are located farthest away from each other in an outer edge of the base portion in a plan view. In this case, a large region that can be used for cleaning can be maintained more easily.

(6) A length between the two points of the base portion may be larger than ⅓ and smaller than ½, of the diameter of the substrate in a plan view. In this case, it is possible to clean the entire lower surface of the substrate efficiently without excessively increasing the size of the lower-surface brush.

(7) A brush base according to yet another aspect of the present invention has a second upper surface to which the base portion of the lower-surface brush according to the one aspect or the other aspect of the present invention is connectable, and a lower surface opposite to the second upper surface, wherein an inclined portion that is inclined outwardly and downwardly is formed in a peripheral region of the lower surface. In this brush base, in a case where being used when the lower surface of the substrate is cleaned with use of the above-mentioned lower-surface brush, the cleaning liquid is discharged outwardly via the inclined portion without being guided inwardly of the lower surface of the brush base. Thus, the lower surface of the substrate can be cleaned efficiently.

(8) A substrate cleaning device according to yet another aspect of the present invention includes a substrate holder that holds a substrate, and the lower-surface brush according to the one aspect or the other aspect of the present invention that cleans a lower surface of a substrate held by the substrate holder. In this substrate cleaning device, the lower surface of the substrate held by the substrate holder is cleaned by the above-mentioned lower-surface brush. Thus, the lower surface of the substrate can be cleaned efficiently.

(9) The substrate cleaning device may further include a movement device that moves the lower-surface brush between a first horizontal position at which a lower-surface outer region surrounding a lower-surface center region of a substrate is cleanable, and a second horizontal position at which the lower-surface center region of the substrate is cleanable. In this case, the entire lower surface of the substrate can be cleaned efficiently.

(10) The substrate holder may rotate a substrate at least when the lower-surface outer region of the substrate is cleaned by the lower-surface brush. In this case, the lower-surface outer region of the substrate can be cleaned more efficiently. Thus, the entire lower surface of the substrate can be cleaned more efficiently.

(11) The substrate cleaning device may further include a rotation driving device that is capable of rotating the lower-surface brush about a vertical axis extending through the geometric center of the base portion. In this case, a large region that is cleanable by the lower-surface brush can be maintained more easily.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 14 is a schematic diagram for explaining one example of the operation of the substrate cleaning device of FIG. 11;

FIG. 15 is a schematic diagram for explaining one example of the operation of the substrate cleaning device of FIG. 11;

FIG. 16 is a schematic diagram for explaining one example of the operation of the substrate cleaning device of FIG. 11;

FIG. 17 is a schematic diagram for explaining one example of the operation of the substrate cleaning device of FIG. 11;

FIG. 18 is a schematic diagram for explaining one example of the operation of the substrate cleaning device of FIG. 11;

FIG. 19 is a schematic diagram for explaining one example of the operation of the substrate cleaning device of FIG. 11;

FIG. 20 is a schematic diagram for explaining one example of the operation of the substrate cleaning device of FIG. 11;

FIG. 21 is a schematic diagram for explaining one example of the operation of the substrate cleaning device of FIG. 11;

FIG. 22 is a schematic diagram for explaining one example of the operation of the substrate cleaning device of FIG. 11;

FIG. 23 is a schematic diagram for explaining one example of the operation of the substrate cleaning device of FIG. 11;

FIG. 24 is a schematic diagram for explaining one example of the operation of the substrate cleaning device of FIG. 11.

DETAILED DESCRIPTION

A lower-surface brush, a brush base and a substrate cleaning device according to embodiments of the present invention will be described below with reference to drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like.

[1] First Embodiment (1) Configuration of Brush Unit

Figure 1:
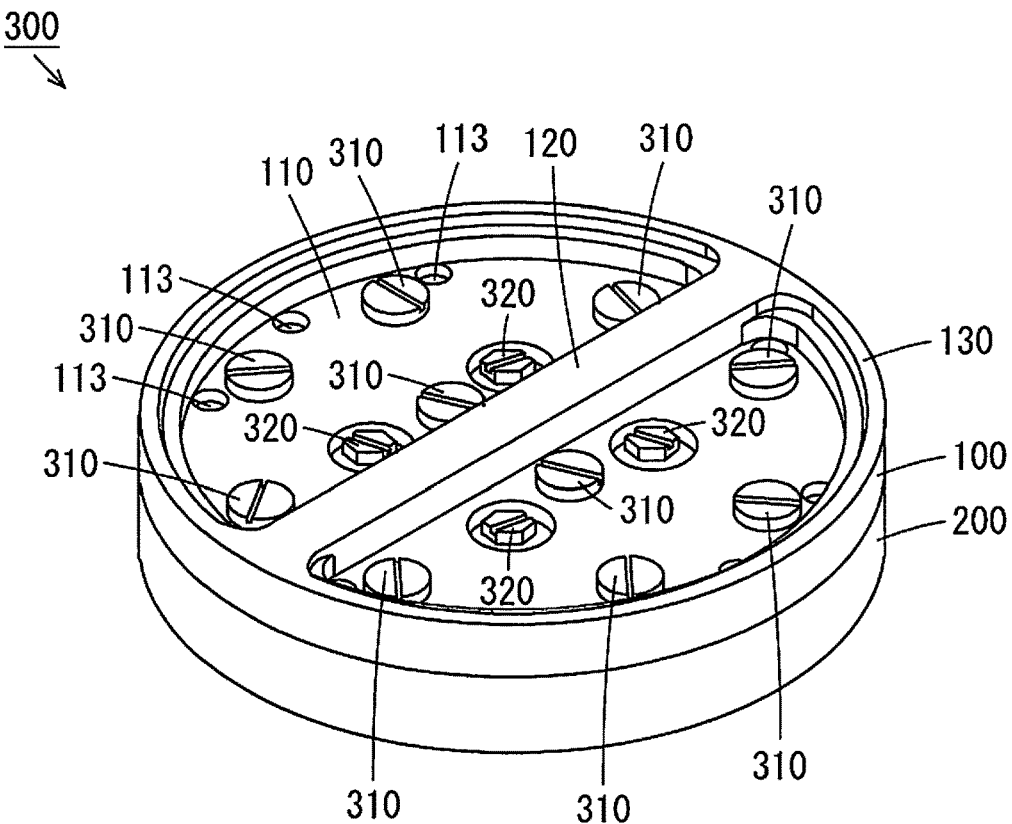
FIG. 1 is an external perspective view of a brush unit including a lower-surface brush and a brush base according to a first embodiment of the present invention.

FIG. 1 is an external perspective view of a brush unit including the lower-surface brush and the brush base according to a first embodiment of the present invention. As shown in FIG. 1, the brush unit 300 is constituted by the lower-surface brush 100 being attached onto the brush base 200. The lower-surface brush 100 may be formed of a relatively soft resin material such as PVA (Polyvinyl alcohol) or PTFE (Polytetrafluoroethylene). The brush base 200 may be formed of a relatively hard resin material such as PVC (polyvinyl chloride) or PP (polypropylene).

Figure 2:
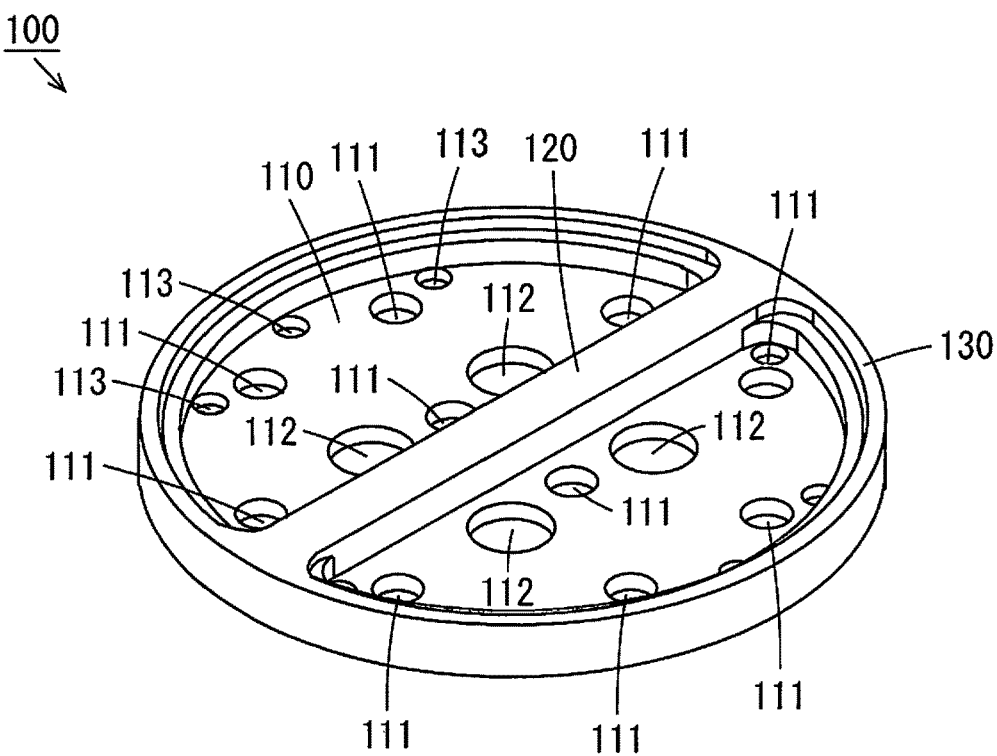
FIG. 2 is an external perspective view of the lower-surface brush of FIG. 1.
Figure 3:
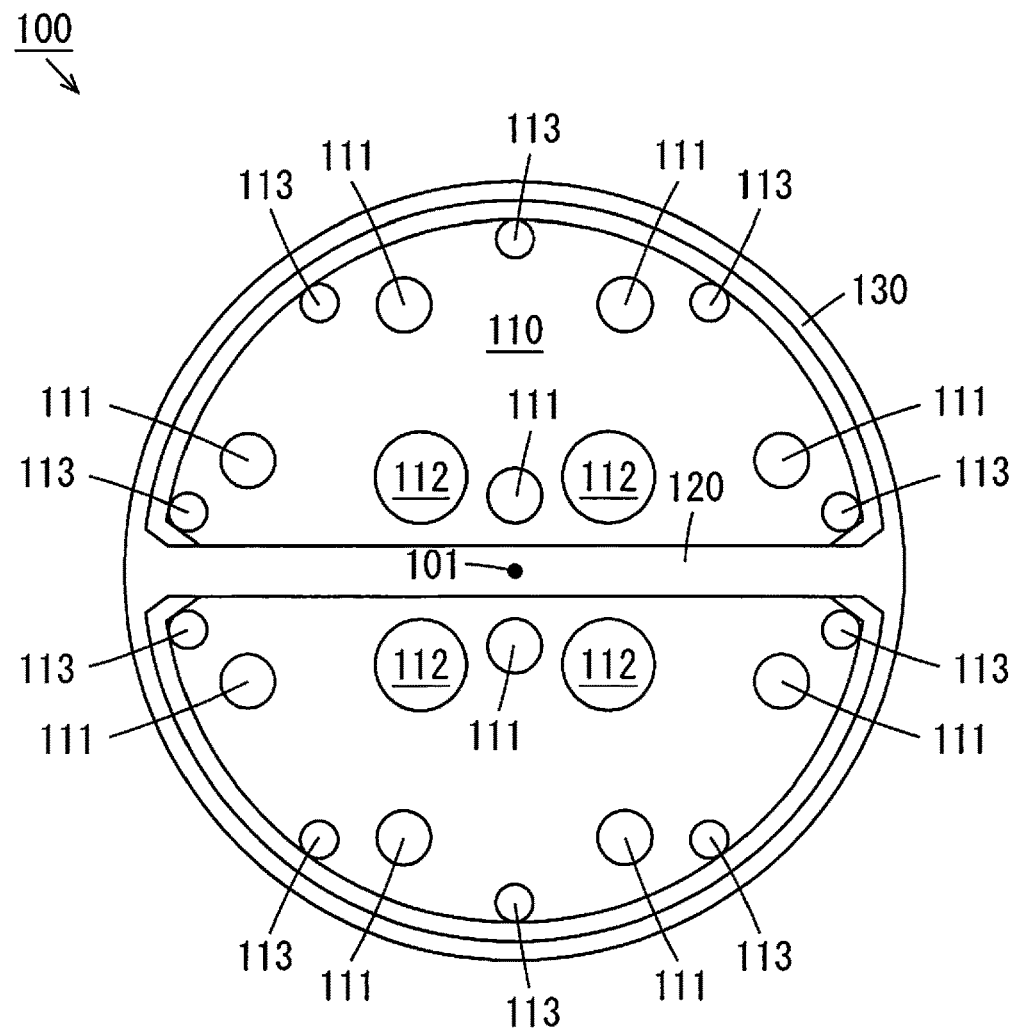
FIG. 3 is a plan view of the lower-surface brush of FIG. 1.

FIG. 2 is an external perspective view of the lower-surface brush 100 of FIG. 1. FIG. 3 is a plan view of the lower-surface brush 100 of FIG. 1. As shown in FIGS. 2 and 3, the lower-surface brush 100 includes a base portion 110 and cleaning portions 120, 130. The base portion 110 has a disc shape. In a plan view, a geometric center 101 (FIG. 3) of the base portion 110 is defined.

The cleaning portion 120 and the cleaning portion 130 are formed on the upper surface of the base portion 110 to project upwardly from the upper surface of the base portion 110. The cleaning portion 120 is arranged to extend in a radial direction of the base portion 110 through the geometric center 101 of the base portion 110. The cleaning portion 130 is arranged to extend along the outer edge of the base portion 110. The cleaning portion 130 may come into contact with both ends of the cleaning portion 120. A projection amount of the cleaning portions 120, 130 with respect to the upper surface of the base portion 110 is 5 mm to 6 mm, for example. The width of the cleaning portion 120 and the width of the cleaning portion 130 may be equal to each other or different from each other.

A plurality of through holes 111, a plurality of through holes 112 and a plurality of through holes 113 are formed in the base portion 110. Each through hole 111 to 113 extends in an up-and-down direction. The through holes 111 are used to connect the base portion 110 to the brush base 200 of FIG. 1. 10 through holes 111 are provided in the present example. Specifically, 8 through holes 111 are arranged in the peripheral region of the base portion 110 at substantially equal angular intervals. 2 through holes 111 are arranged in the center region of the base portion 110 to be opposite to each other with the cleaning portion 120 interposed therebetween.

The through holes 112 are used to connect the brush base 200 to a motor for rotating the brush unit 300, or the like. 4 through holes 112 are provided in the present example. The 4 through holes 112 are arranged in the center region of the base portion 110 at substantially equal angular intervals to surround the geometric center 101 of the base portion 110. The through holes 113 are used to discharge a cleaning liquid when a substrate is cleaned. 10 through holes 113 are provided in the present example. The 10 through holes 113 are arranged systematically in the peripheral region of the base portion 110 to extend along the cleaning portion 130.

Figure 4:
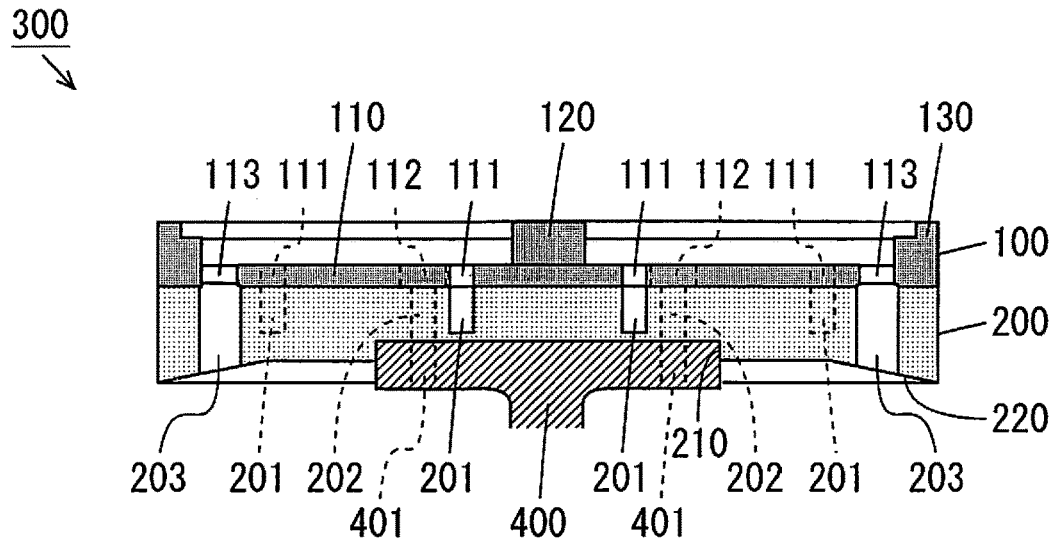
FIG. 4 is a longitudinal cross sectional view of the brush unit of FIG. 1.

The brush base 200 is a plate-shape member having an outer shape similar to that of the base portion 110 of the lower-surface brush 100. FIG. 4 is a longitudinal cross sectional view of the brush unit 300 of FIG. 1. As shown in FIG. 4, a concave portion 210 that is concaved upwardly is formed in the center region of the lower surface of the brush base 200. Further, in the peripheral region of the lower surface of the brush base 200, an inclined portion 220 that is inclined outwardly and downwardly is formed. Further, a plurality of screw holes 201, a plurality of through holes 202 and a plurality of through holes 203 are formed in the brush base 200.

The plurality of screw holes 201 are provided in the upper surface of the brush base 200 to respectively correspond to the plurality of through holes 111 of the lower-surface brush 100. The plurality of through holes 202 are arranged to extend in the up-and-down direction and respectively correspond to the plurality of through holes 112 of the lower-surface brush 100. The plurality of through holes 203 are arranged to extend in the up-and-down direction and respectively correspond to the plurality of through holes 113 of the lower-surface brush 100.

A plurality of screw members 310 (FIG. 1) are respectively inserted into the plurality of through holes 111 of the lower-surface brush 100 from above. The lower end portion of each screw member 310 is screwed into a corresponding screw hole 201 of the brush base 200. Thus, the lower-surface brush 100 and the brush base 200 are connected to each other, so that the brush unit 300 is completed. In the brush unit 300, the plurality of through holes 113 of the lower-surface brush 100 respectively communicate with the plurality of through holes 203 of the brush base 200.

The brush unit 300 is attached to a rotation shaft 400 of a motor or the like. Specifically, the rotation shaft 400 is fitted into the concave portion 210 of the brush base 200 from below. A plurality of screw holes 401 respectively corresponding to the through holes 202 of the brush base 200 are formed in the rotation shaft 400. A plurality of screw members 320 (FIG. 1) are respectively inserted into the plurality of through holes 112 of the lower-surface brush 100 from above. The lower end portion of each screw member 320 is screwed into a corresponding screw hole 401 of the rotation shaft 400 through a corresponding through hole 202 of the brush base 200.

(2) Operation of Brush Unit

The brush unit 300 is used to clean a lower surface of a substrate. Hereinafter, a center portion of a lower surface of a substrate is referred to as a lower-surface center region. A region surrounding a lower-surface center region in a lower surface of a substrate is referred to as a lower-surface outer region. A lower surface of a substrate refers to a surface, facing downwardly, of the substrate. Therefore, in a case where a circuit forming surface (main surface) of a substrate faces downwardly, the main surface of the substrate is a lower surface. In a case where the surface (back surface) opposite to the main surface faces downwardly, the back surface of the substrate is a lower surface.

Figure 5:
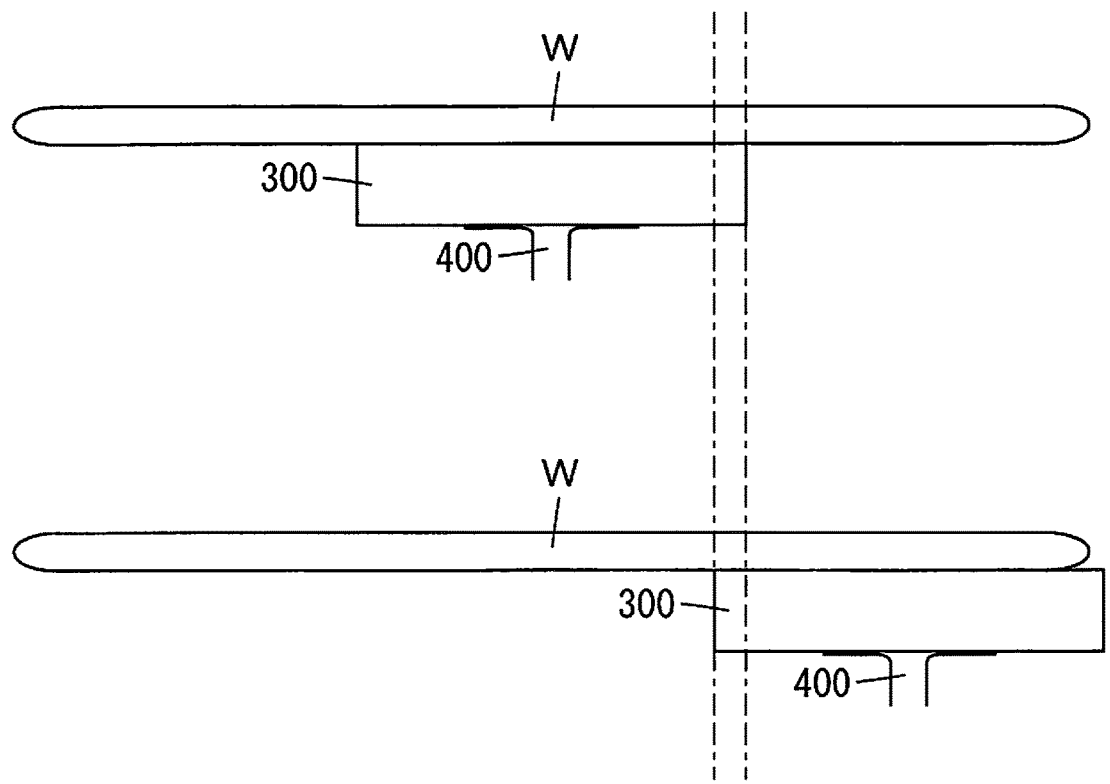
FIG. 5 is a diagram for explaining the operation of the brush unit.

FIG. 5 is a diagram for explaining the operation of the brush unit 300. As shown in the upper field of FIG. 5, when a lower-surface center region of a substrate W is cleaned, the brush unit 300 is moved a position below the lower-surface center region of the substrate W. Next, the upper end portion of the brush unit 300 comes into contact with the lower surface of the substrate W. Thereafter, the brush unit 300 is rotated about a vertical axis passing through the geometric center 101 of the base portion 110, whereby contaminants adhering to the lower-surface center region of the substrate W are removed.

In the present example, when the lower-surface center region of the substrate W is cleaned, the substrate W is not rotated. However, the substrate W may be rotated.

As shown in the lower field of FIG. 5, when the lower-surface outer region of the substrate W is cleaned, the brush unit 300 is moved to a position below the lower-surface outer region of the substrate W. At this time, part of the brush unit 300 may project slightly farther outwardly than the substrate W. Next, the upper end portion of the brush unit 300 comes into contact with the lower surface of the substrate W. Thereafter, the substrate W is rotated, so that contaminants adhering to the lower-surface outer region of the substrate W are removed. In the present example, when the lower-surface outer region of the substrate W is cleaned, the brush unit 300 is not rotated. However, the brush unit 300 may be rotated.

In the present example, the diameter of the lower-surface brush 100 may be larger than $\frac{1}{3}$ and smaller than $\frac{1}{2}$, of the diameter of the substrate W. In this case, the brush unit 300 is moved between a position below the lower-surface center region of the substrate W and a position below the lower-surface outer region of the substrate W. Thus, the entire lower surface of the substrate W is cleaned efficiently. Therefore, it is not necessary to excessively increase the size of the lower-surface brush 100. The diameter of the substrate W is 300 mm, for example. As indicated by one-dot and dash lines in FIG. 5, a region that is cleanable when the brush unit 300 is moved to a position below the lower-surface center region of the substrate W and a region that is cleanable when the brush unit 300 is moved to a position below the lower-surface outer region of the substrate W may slightly overlap with each other.

When the lower surface of the substrate W is cleaned, a cleaning liquid may be supplied to the lower surface of the substrate W. In this case, contaminants adhering to the lower surface of the substrate W can be removed more efficiently. The cleaning liquid that has been supplied to the lower surface of the substrate W is discharged to the lower surface of the brush base 200 through the plurality of through holes 113 formed in the lower-surface brush 100 and the plurality of through holes 203 formed in the brush base 200 of FIG. 4. Therefore, the cleaning liquid is prevented from staying on the lower-surface brush 100.

Here, as shown in FIG. 4, the inclined portion 220 that is inclined outwardly and downwardly is formed in the peripheral region of the lower surface of the brush base 200. Therefore, the cleaning liquid that has been discharged to the lower surface of the brush base 200 is guided outwardly via the inclined portion 220 to be discharged from the brush base 200 without being guided inwardly of the brush base 200. Thus, the cleaning liquid is prevented from adhering to the rotation shaft 400, a motor or the like.

(3) Modified Example

While the outer shape of the lower-surface brush 100 in a plan view is circular in the present embodiment, the embodiment is not limited to this. The outer shape of the lower-surface brush 100 in a plan view may be another shape. In this case, a cleaning portion 120 is provided to extend between two points that are located farthest away from each other in the outer edge of a base portion 110 in a plan view. Thus, a large region that can be used for cleaning can be maintained. Differences of the lower-surface brush 100 according to the modified example from the lower-surface brush 100 of FIG. 2 will be described below.

Figure 6:
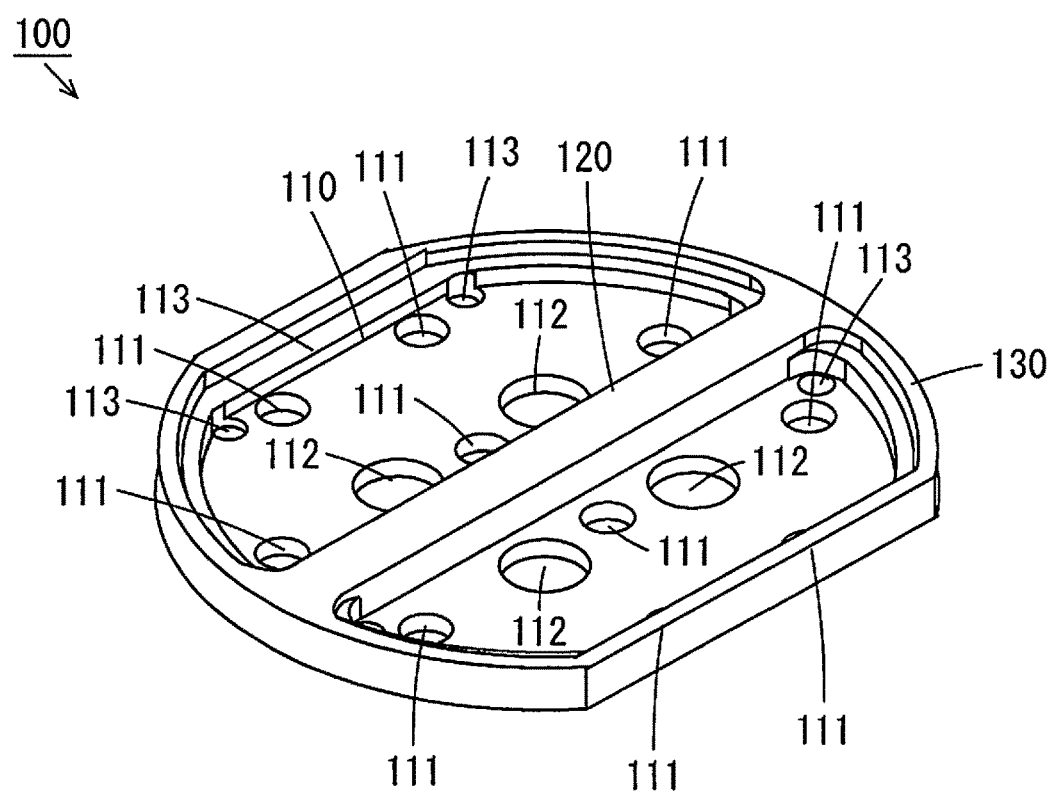
FIG. 6 is an external perspective view of a lower-surface brush according to a modified example.

FIG. 6 is an external perspective view of the lower-surface brush 100 according to the modified example. As shown in FIG. 6, in the lower-surface brush 100 according to the modified example, a base portion 110 has an oblong disc shape. A cleaning portion 120 is arranged to pass through the geometric center 101 of the base portion 110 in a plan view and extend parallel to the long side of the base portion 110. A brush base 200 has an oblong disc shape similarly to the base portion 110 of the lower-surface brush 100. In this example, the outer shape of the lower-surface brush 100 in a plan view is oblong.

Alternatively, the base portion 110 may have an oval disc shape. In this case, the cleaning portion 120 is arranged to pass through the geometric center 101 of the base portion 110 in a plan view and extend while overlapping with the major diameter of the base portion 110. The geometric center 101 of the base portion 110 in a plan view is at the intersection of the major diameter and a minor diameter of the base portion 110. The brush base 200 has an oval outer shape similarly to the base portion 110 of the lower-surface brush 100. In this example, the outer shape of the lower-surface brush 100 in a plan view is oval.

(4) Effects

In the lower-surface brush 100 according to the present embodiment, the cleaning portion 120 is provided on the upper surface of the base portion 110 to project upwardly from the upper surface of the base portion 110 and extend in one direction through the geometric center 101 of the base portion 110 in a plan view. Further, the cleaning portion 130 is provided on the upper surface of the base portion 110 to project upwardly from the upper surface of the base portion 110 and extend along the outer edge of the base portion 110.

With this configuration, the contact area between the lower surface of the substrate W and the lower-surface brush 100 is reduced while a large region that can be used for cleaning is maintained. Therefore, even in a case where a load applied to the lower-surface brush 100 is relatively small, the lower surface of the substrate W and the lower-surface brush 100 come into contact with each other while receiving a sufficient load. Thus, the lower surface of the substrate W can be cleaned efficiently.

(5) Reference Example

Figure 7:
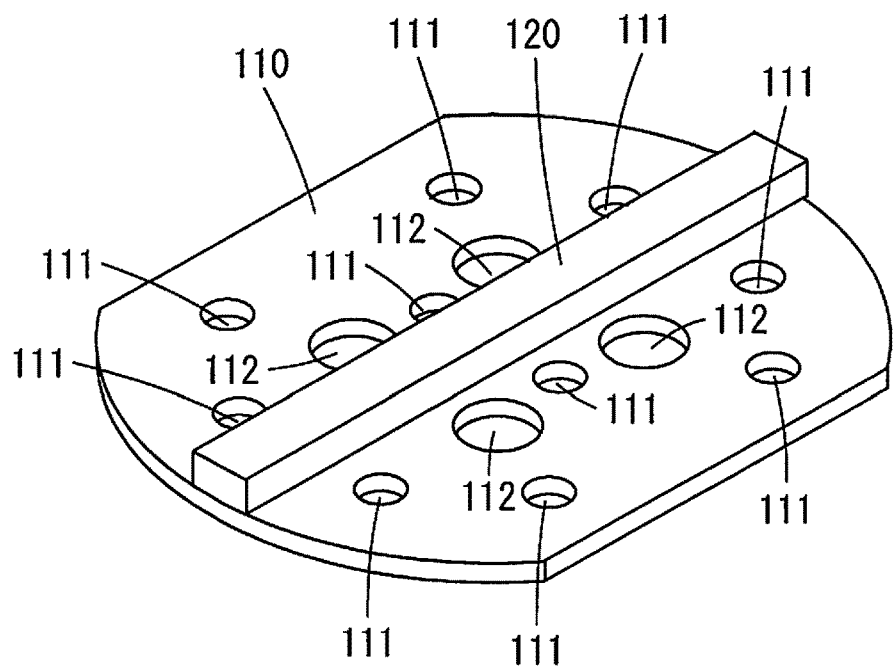
FIG. 7 is an external perspective view of a lower-surface brush according to a reference example.

FIG. 7 is an external perspective view of a lower-surface brush according to a reference example. As shown in FIG. 7, the lower-surface brush 100A according to the reference example has the configuration similar to that of the lower-surface brush 100 according to the modified example of FIG. 6 except that a cleaning portion 130 is not included and through holes 113 are not formed in a base portion 110. Further, the through holes 203 do not have to be formed in the brush base corresponding to the lower-surface brush 100A.

In a case where a lower-surface outer region of a substrate W is cleaned by a brush unit including the lower-surface brush 100A according to the reference example, the brush unit is preferably rotated. Alternatively, the orientation of the lower-surface brush 100 is preferably detected by an encoder or the like. Further, in a case where the lower-surface outer region of the substrate W is cleaned, the orientation of the lower-surface brush 100 is preferably controlled such that a cleaning portion 120 is directed in a direction orthogonal to the tangent of the outer edge of the substrate W (a normal direction) below the lower-surface outer region of the substrate W.

[2] Second Embodiment (1) Configuration of Brush Unit

Figure 8:
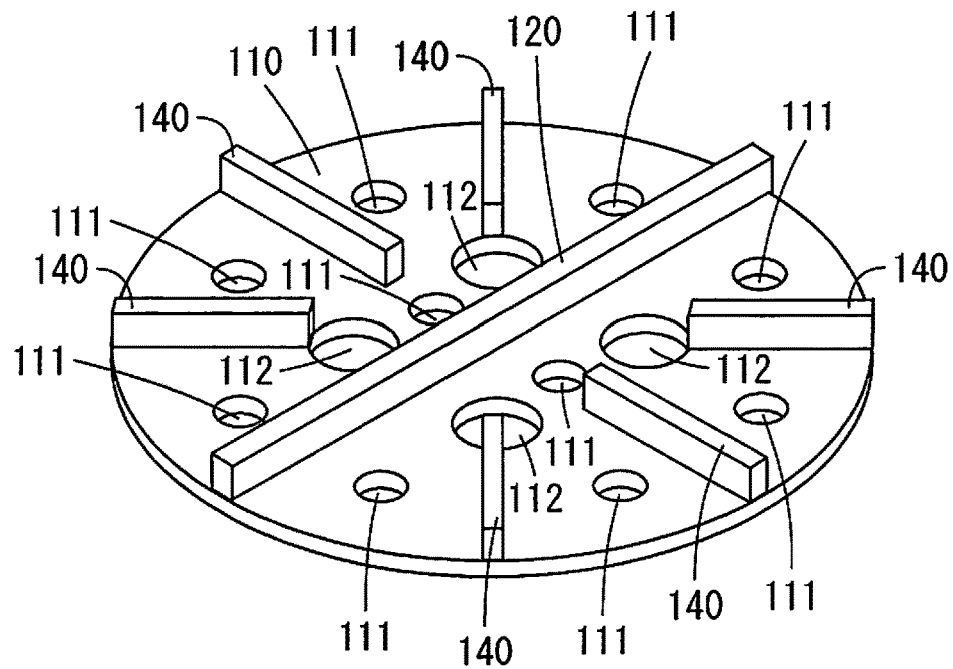
FIG. 8 is an external perspective view of a lower-surface brush according to a second embodiment of the present invention.

Differences of a lower-surface brush 100 and a brush base 200 according to a second embodiment from the lower-surface brush 100 and the brush base 200 according to the first embodiment will be described. FIG. 8 is an external perspective view of the lower-surface brush 100 according to the second embodiment of the present invention. As shown in FIG. 8, in the present embodiment, instead of the cleaning portion 130 of FIG. 1, the lower-surface brush 100 includes one or a plurality of pairs of cleaning portions 140 that are arranged to be opposite to each other with a cleaning portion 120 interposed therebetween.

In the present example, the lower-surface brush 100 includes three pairs of cleaning portions 140. Each cleaning portion 140 is formed on the upper surface of a base portion 110 to extend toward a geometric center 101 of the base portion 110 from outside of the base portion 110 and project upwardly from the upper surface of the base portion 110. A projection amount of the cleaning portion 140 with respect to the upper surface of the base portion 110 is 5 mm to 6 mm, for example. The width of a cleaning portion 120 and the width of a cleaning portion 140 may be equal to each other or different from each other. Further, the inner end portion of each cleaning portion 140 may come into contact with a cleaning portion 120.

A brush unit 300 is constituted by the lower-surface brush 100 of FIG. 8 being connected to the brush base 200 of FIG. 1. The operation of the brush unit 300 in the present embodiment is similar to the operation of the brush unit 300 in the first embodiment.

In a case where a cleaning liquid is used when a substrate is cleaned, the cleaning liquid that has been supplied to the lower surface of the substrate W is discharged outwardly from the peripheral edge of the base portion 110 through the spaces between cleaning portions 120, 140. Therefore, the cleaning liquid is prevented from staying on the lower-surface brush 100. Therefore, in the present embodiment, the through holes 113 of FIG. 4 do not have to be formed in the base portion 110 of the lower-surface brush 100. Similarly, the through holes 203 of FIG. 4 do not have to be formed in the brush base 200. However, the embodiment is not limited to this. The through holes 113 may be formed in the base portion 110 of the lower-surface brush 100, or the through holes 203 may be formed in the brush base 200.

Further, in a case where a lower-surface outer region of a substrate W is cleaned, the brush unit 300 may be rotated. Alternatively, the orientation of the lower-surface brush 100 may be detected by an encoder or the like. Further, in a case where the lower-surface outer region of the substrate W is cleaned, the orientation of the lower-surface brush 100 may be controlled such that the cleaning portion 120 is directed in a direction orthogonal to the tangent of the outer edge of the substrate W (a normal direction) below the lower-surface outer region of the substrate W.

(2) Modified Examples

While each cleaning portion 140 extends toward the geometric center 101 of the base portion 110 from outside of the base portion 110 in the present embodiment, the embodiment is not limited to this. Each cleaning portion 140 does not have to extend toward the geometric center 101 of the base portion 110 from outside of the base portion 110. Further, similarly to the modified example in the first embodiment, the outer shape of a lower-surface brush 100 in a plan view may be another shape such as an oblong or an oval. Differences of a lower-surface brush 100 according to a modified example from the lower-surface brush 100 of FIG. 8 will be described below.

Figure 9:
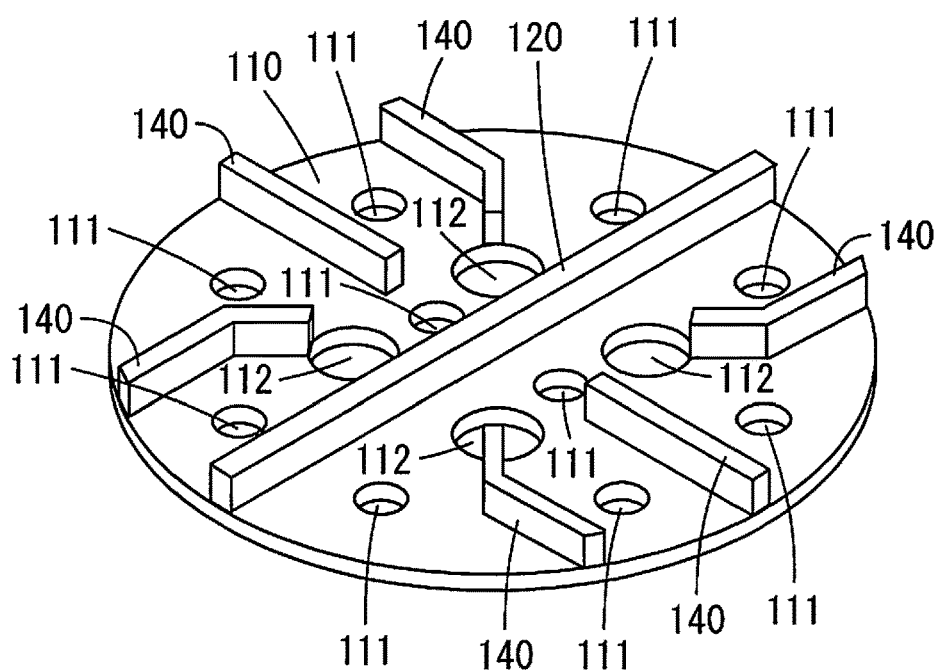
FIG. 9 is an external perspective view of a lower-surface brush according to a first modified example.

FIG. 9 is an external perspective view of a lower-surface brush 100 according to a first modified example. As shown in FIG. 9, in the lower-surface brush 100 according to the first modified example, part of a cleaning portion 140 extends toward a geometric center 101 of a base portion 110 from outside of the base portion 110 while being bent. Part of a cleaning portion 140 may extend toward the geometric center 101 of the base portion 110 from outside of the base portion 110 while being curved.

Figure 10:
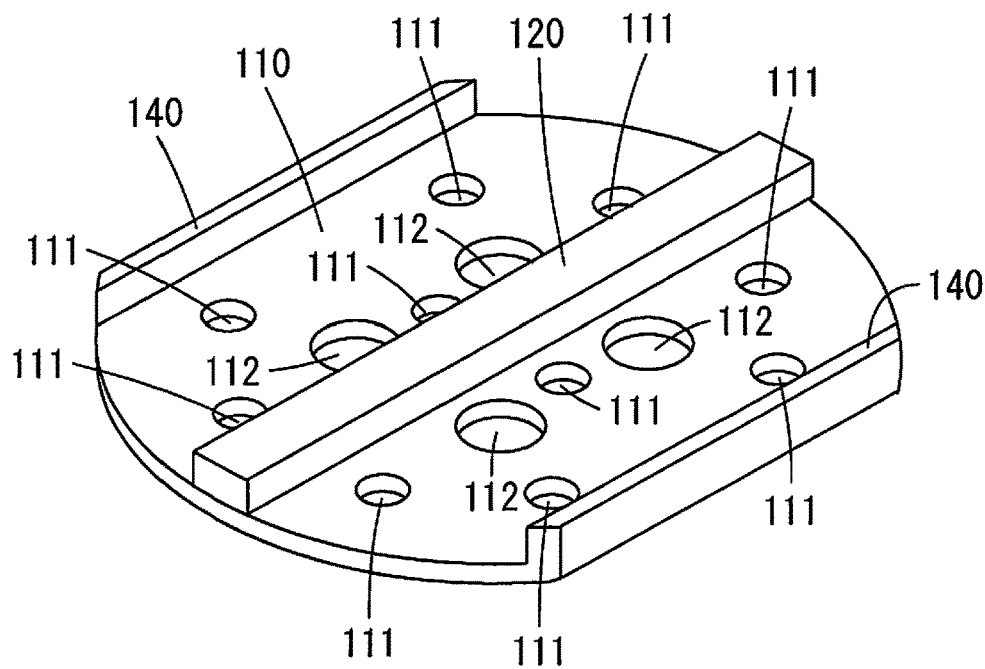
FIG. 10 is an external perspective view of a lower-surface brush according to a second modified example.

FIG. 10 is an external perspective view of a lower-surface brush 100 according to a second modified example. As shown in FIG. 10, the lower-surface brush 100 according to the second modified example includes a pair of cleaning portions 140. Further, a base portion 110 has an oblong disc shape. A cleaning portion 120 is arranged to pass through a geometric center 101 of the base portion 110 in a plan view and extend parallel to the long side of the base portion 110. The pair of cleaning portions 140 is arranged to respectively extend along a pair of long sides of the base portion 110.

(3) Effects

In the lower-surface brush 100 according to the present embodiment, the cleaning portion 120 is provided on the upper surface of the base portion 110 to project upwardly from the upper surface of the base portion 110 and extend in one direction through the geometric center 101 of the base portion 110 in a plan view. Further, the one or plurality of pairs of cleaning portions 140 are provided on the upper surface of the base portion 110 to project upwardly from the upper surface of the base portion 110 and be opposite to each other with the cleaning portion 120 interposed therebetween.

With this configuration, the contact area between the lower surface of the substrate W and the lower-surface brush 100 is reduced while a large region that can be used for cleaning is maintained. Therefore, even in a case where a load applied to the lower-surface brush 100 is relatively small, the lower surface of the substrate W and the lower-surface brush 100 come into contact with each other while receiving a sufficient load. Thus, the lower surface of the substrate W can be cleaned efficiently.

[3] Third Embodiment (1) Configuration of Substrate Cleaning Device

Figure 11:
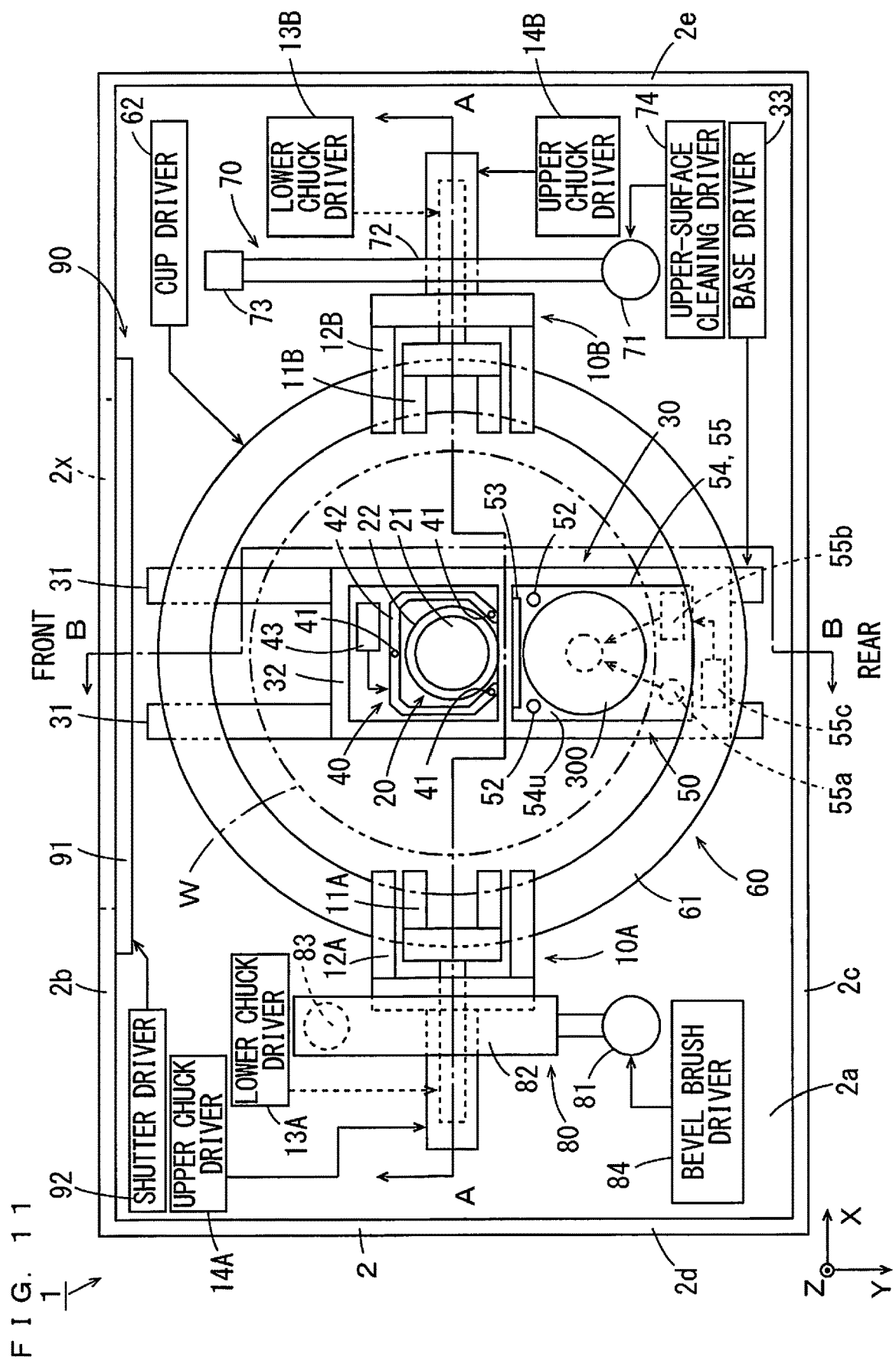
FIG. 11 is a schematic plan view of a substrate cleaning device according to a third embodiment of the present invention.
Figure 12:
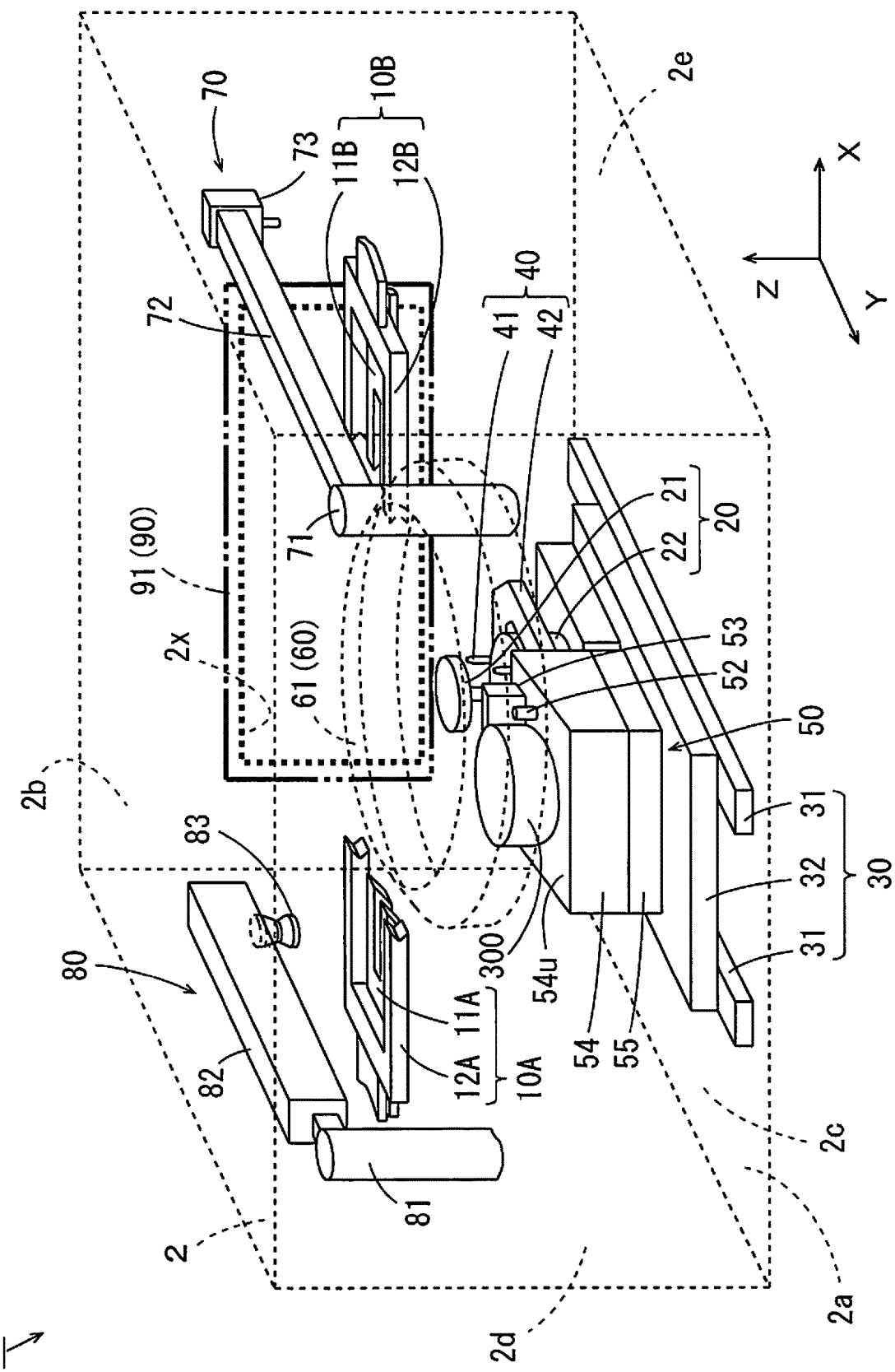
FIG. 12 is an external perspective view showing the inner configuration of the substrate cleaning device of FIG. 11.

As a third embodiment, the detailed configuration of a substrate cleaning device including the lower-surface brush 100 in the first or second embodiment will be described. FIG. 11 is a schematic plan view of the substrate cleaning device according to the third embodiment of the present invention. FIG. 12 is an external perspective view showing the inner configuration of the substrate cleaning device 1 of FIG. 11. In the substrate cleaning device 1 according to the present embodiment, X, Y and Z directions orthogonal to one another are defined for the clarity of a positional relationship. In FIG. 11 and the subsequent drawings, the X, Y and Z directions are suitably indicated by arrows. The X and Y directions are orthogonal to each other within a horizontal plane, and the Z direction corresponds to a vertical direction.

As shown in FIG. 11, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 12, the unit casing 2 is indicated by the dotted lines.

The unit casing 2 has a rectangular bottom surface portion 2a, and four sidewall portions 2b, 2c, 2d, 2e extending upwardly from four sides of the bottom surface portion 2a. The sidewall portions 2b, 2c are opposite to each other, and the sidewall portions 2d, 2e are opposite to each other. A rectangular opening is formed in the center portion of the sidewall portion 2b. This opening is an inlet-outlet port 2x for a substrate W and is used when a substrate W is carried into and carried out from the unit casing 2. In FIG. 12, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

An opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 12, the shutter 91 is indicated by the thick two-dots and dash lines. The shutter driver 92 drives the shutter 91 to open the inlet-outlet port 2x when a substrate W is carried into and carried out from the substrate cleaning device 1. Further, the shutter driver 92 drives the shutter 91 to close the inlet-outlet port 2x when a cleaning process is performed on a substrate W in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in a plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of a substrate W by suction and is configured to be rotatable about an axis extending in the up-and-down direction (the axis extending in the Z direction). In FIG. 11, the outer shape of a substrate W that is held by suction by the lower holding device 20 is indicated by the two-dots and dash line.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding a substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in a plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts or lowers the pin coupling member 42 on the mobile base 32. Thus, the plurality of support pins 41 are lifted or lowered relative to the suction holder 21.

The lower-surface cleaning device 50 includes a brush unit 300, two liquid nozzles 52, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 12, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

The brush unit 300 includes the lower-surface brush 100 according to the first or second embodiment and a brush base 200. The brush unit 300 may include a brush base in which the inclined portion 220 (FIG. 4) is not formed on the lower surface instead of the brush base 200 according to the first or second embodiment. As shown in FIG. 11, the brush unit 300 is attached to the upper surface 54u of the lifting-lowering supporter 54 such that the lower-surface brush 100 is directed upwardly and rotatable about an axis extending in the up-and-down direction through the geometric center 101 (FIG. 3) of the base portion 110. An area of the base portion 110 of the lower-surface brush 100 is larger than an area of a suction surface of the suction holder 21.

Each of the two liquid nozzles 52 is attached to the upper surface 54u of the lifting-lowering supporter 54 to be located in the vicinity of the brush unit 300. Further, each of the two liquid nozzles 52 is attached to the upper surface 54u such that a liquid discharge port is directed upwardly. A lower-surface cleaning liquid supplier 56 (FIG. 13) is connected to the liquid nozzles 52. The lower-surface cleaning liquid supplier 56 supplies a cleaning liquid to the liquid nozzles 52. When a substrate W is cleaned by the brush unit 300, the liquid nozzles 52 supply the cleaning liquid supplied from the lower-surface cleaning liquid supplier 56 to the lower surface of the substrate W. In the present embodiment, pure water (deionized water) is used as the cleaning liquid to be supplied to the liquid nozzles 52. As the cleaning liquid to be supplied to the liquid nozzles 52, carbonated water, ozone water, hydrogen water, electrolytic ionized water, SC1 (a mixed solution of ammonia and a hydrogen peroxide solution), TMAH (tetramethylammonium hydroxide) or the like can be used instead of pure water.

The gas injector 53 is a slit-like gas injection nozzle having a gas injection port extending in one direction. The gas injector 53 is attached to the upper surface 54u of the lifting-lowering supporter 54 to be located between the brush unit 300 and the suction holder 21 in a plan view. Further, the gas injector 53 is attached to the upper surface 54u of the lifting-lowering supporter 54 such that a gas injection port is directed upwardly. An injection gas supplier 57 (FIG. 13) is connected to the gas injector 53. The injection gas supplier 57 supplies gas to the gas injector 53. In the present embodiment, a nitrogen gas is used as the gas to be supplied to the gas injector 53. The gas injector 53 injects the gas supplied from the injection gas supplier 57 to the lower surface of a substrate W when the substrate W is cleaned by the brush unit 300 and when the lower surface of a substrate W is dried, as described below. In this case, a strip-shaped gas curtain extending in the X direction is formed between the brush unit 300 and the suction holder 21. As the gas to be supplied to the gas injector 53, an inert gas such as an argon gas or a helium gas can be used instead of a nitrogen gas.

The lower-surface brush rotation driver 55a includes a motor having the rotation shaft 400 (FIG. 4), and rotates the brush unit 300 when a substrate W is cleaned by the brush unit 300. Thus, a large region that is cleanable by the brush unit 300 can be maintained.

The lower-surface brush lifting-lowering driver 55*b* includes a stepping motor or an air cylinder, and lifts or lowers the lifting-lowering supporter 54 with respect to the movement supporter 55. The lower-surface brush movement driver 55*c* includes a motor, and moves the movement supporter 55 in the Y direction on the mobile base 32. Here, the position of the lower holding device 20 in the mobile base 32 is fixed. Therefore, when being moved by the lower-surface brush movement driver 55*c* in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position.

The cup device 60 is further provided in the center portion of the bottom surface portion 2*a*. The cup device 60 includes a cup 61 and a cup driver 62. The cup 61 is provided to surround the lower holding device 20 and the base device 30 in a plan view, and be liftable and lowerable. In FIG. 12, the cup 61 is indicated by the dotted lines. The cup driver 62 moves the cup 61 between a lower cup position and an upper cup position in accordance with which portion of the lower surface of a substrate W is to be cleaned by the brush unit 300. The lower cup position is a height position at which the upper end portion of the cup 61 is located farther downwardly than a substrate W held by suction by the suction holder 21. Further, the upper cup position is a height position at which the upper end portion of the cup 61 is located farther upwardly than the suction holder 21.

At height positions farther upward than the cup 61, the pair of upper holding devices 10A, 10B is provided to be opposite to each other with the base device 30 held therebetween in a plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (the front-and-rear direction) through the center of the suction holder 21 in a plan view, and are provided to be movable in the X direction in a common horizontal plane. Each of the lower chucks 11A, 11B has two support pieces that can support a lower-surface peripheral portion of a substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the front-and-rear direction) through the center of the suction holder 21 in a plan view, and are provided to be movable in the X direction in a common horizontal plane. Each of the upper chucks 12A, 12B has two holding pieces that are configured to abut against two portions of the outer peripheral end of the substrate W and be capable of holding the outer peripheral end of a substrate W. The upper chuck drivers 14A, 14B move the upper chucks 12A, 12B such that the upper chucks 12A, 12B are closer to each other or farther away from each other.

As shown in FIG. 11, at a position near one side of the cup 61, the upper-surface cleaning device 70 is provided to be located in the vicinity of the upper holding device 10B in a plan view. The upper-surface cleaning device 70 includes a rotation support shaft 71, an arm 72, a spray nozzle 73 and an upper-surface cleaning driver 74.

The rotation support shaft 71 is supported on the bottom surface portion 2*a* by the upper-surface cleaning driver 74 to extend in the up-and-down direction, and to be liftable, lowerable and rotatable. As shown in FIG. 12, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 13) is connected to the spray nozzle 73. The upper-surface cleaning fluid supplier 75 supplies the cleaning liquid and gas to the spray nozzle 73. In the present embodiment, pure water is used as the cleaning liquid to be supplied to the spray nozzle 73, and a nitrogen gas is used as the gas to be supplied to the spray nozzle 73. When the upper surface of the substrate W is cleaned, the spray nozzle 73 mixes the cleaning liquid and the gas supplied from the upper-surface cleaning fluid supplier 75 to produce a fluid mixture, and injects the produced fluid mixture downwardly.

As the cleaning liquid to be supplied to the spray nozzle 73, carbonated water, ozone water, hydrogen water, electrolytic ionized water, SC1 (a mixed solution of ammonia and a hydrogen peroxide solution), TMAH (tetramethylammonium hydroxide) or the like can be used instead of pure water. Further, as the gas to be supplied to the spray nozzle 73, an inert gas such as an argon gas or a helium gas can be used instead of a nitrogen gas.

The upper-surface cleaning driver 74 includes one or a plurality of pulse motors, an air cylinder and the like, lifts or lowers the rotation support shaft 71, and rotates the rotation support shaft 71. With the above-mentioned configuration, on the upper surface of a substrate W held by suction and rotated by the suction holder 21, the spray nozzle 73 is moved in a circular arc shape. Thus, the entire upper surface of the substrate W can be cleaned.

As shown in FIG. 11, at a position near the other side of the cup 61, the end-portion cleaning device 80 is provided to be located in the vicinity of the upper holding device 10A in a plan view. The end-portion cleaning device 80 includes a rotation support shaft 81, an arm 82, a bevel brush 83 and a bevel brush driver 84.

The rotation support shaft 81 is supported on the bottom surface portion 2*a* by the bevel brush driver 84 to extend in the up-and-down direction and to be liftable, lowerable and rotatable. As shown in FIG. 12, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

The bevel brush 83 is formed of a PVA sponge or a PVA sponge in which abrasive grains are dispersed, for example, and its upper half portion has an inverse trapezoidal shape, and its lower half portion has a trapezoidal shape. With the bevel brush 83, the outer peripheral end of a substrate W can be cleaned with the center portion in the up-and-down direction of the outer peripheral surface.

The bevel brush driver 84 includes one or a plurality of pulse motors, an air cylinder and the like, lifts or lowers the rotation support shaft 81 and rotates the rotation support shaft 81. With the above-mentioned configuration, the center portion of the outer peripheral surface of the bevel brush 83 is brought into contact with the outer peripheral end of a substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of a substrate W is cleaned, a cleaning force of the bevel brush 83 in the outer peripheral end of the substrate W is improved by rotation of the bevel brush 83.

Figure 13:
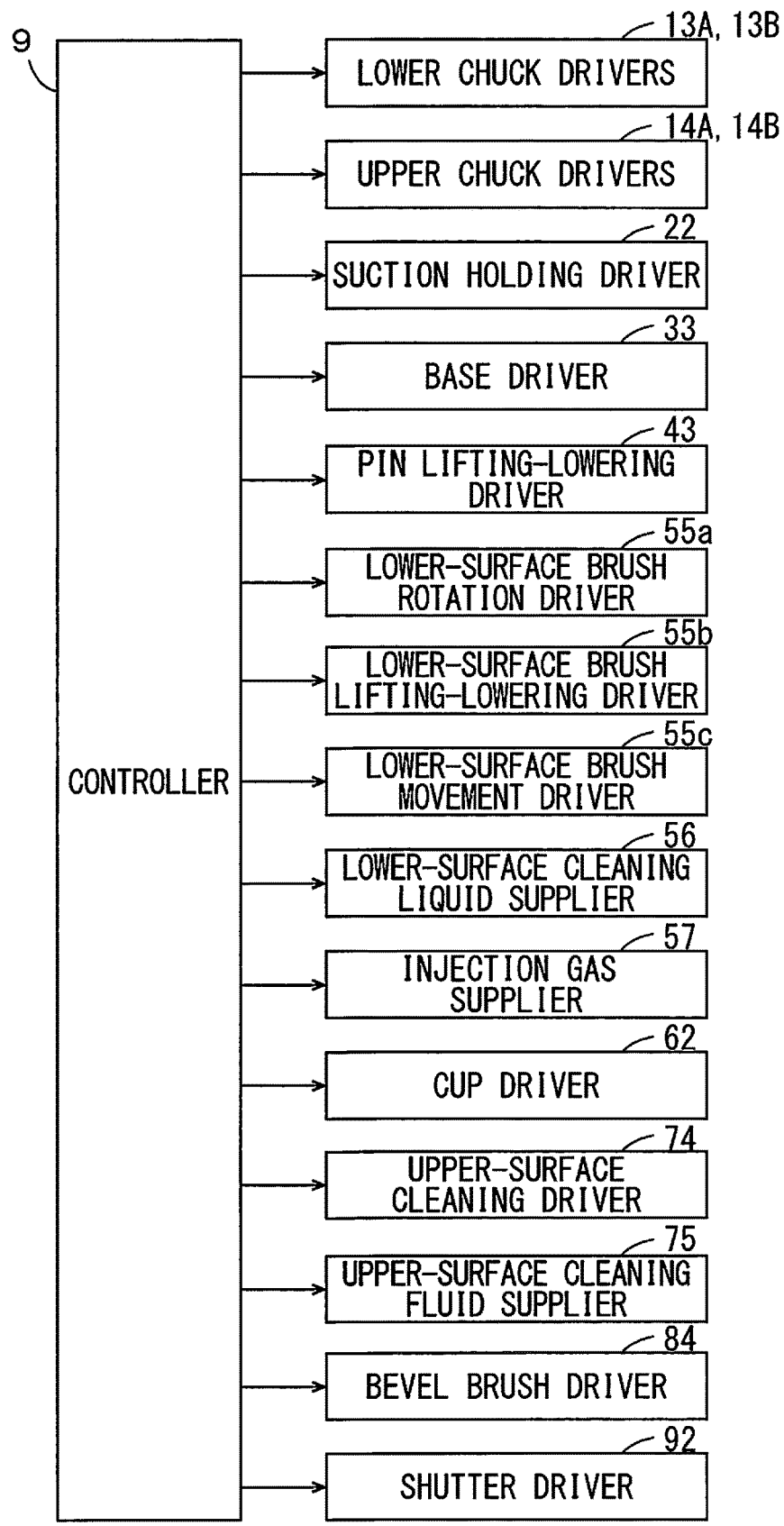
FIG. 13 is a block diagram showing the configuration of a control system of the substrate cleaning device of FIG. 11.
Figure 25:
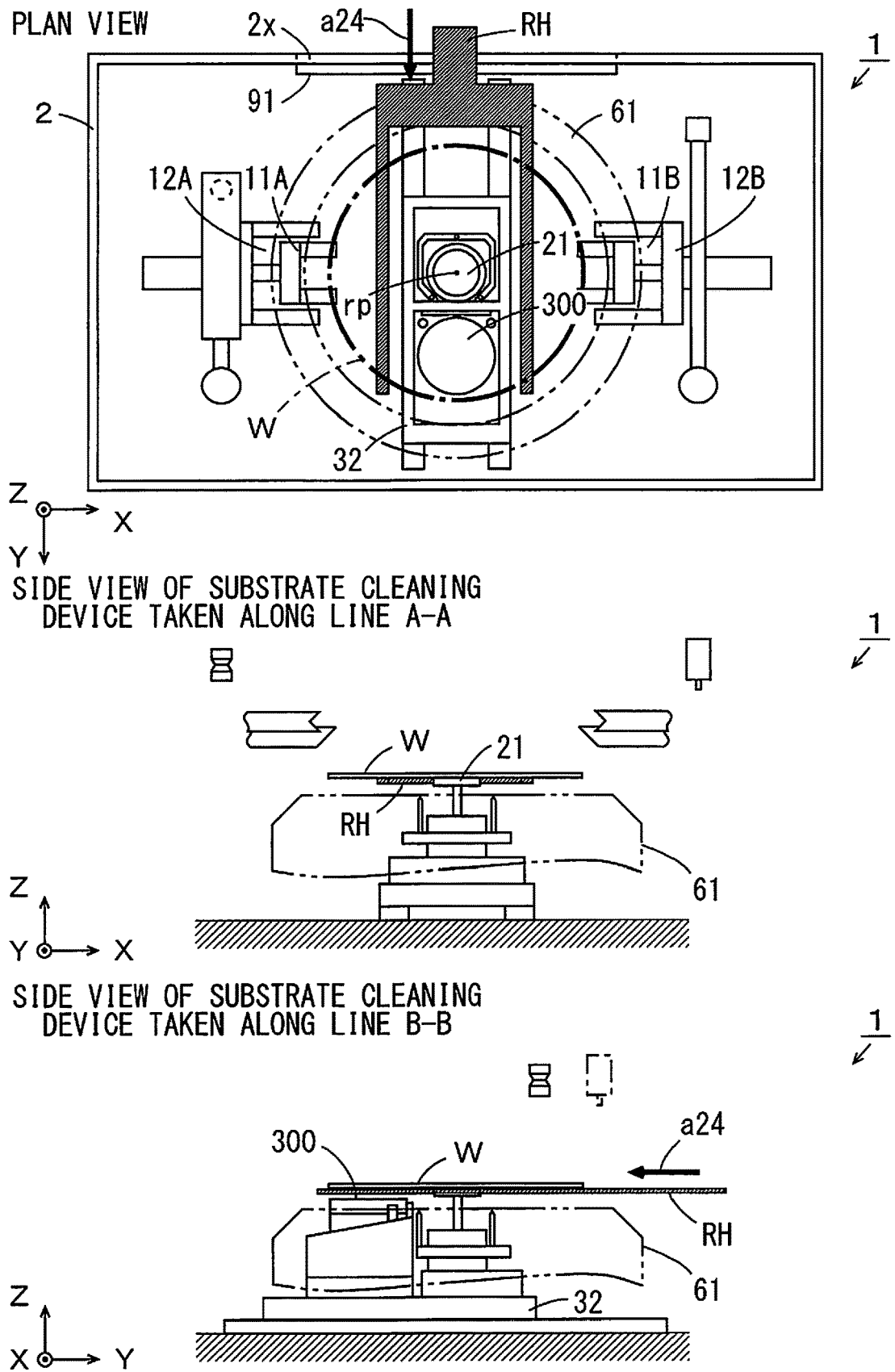
FIG. 25 is a schematic diagram for explaining one example of the operation of the substrate cleaning device of FIG. 11.

FIG. 13 is a block diagram showing the configuration of a control system of the substrate cleaning device 1 of FIG. 11. A controller 9 of FIG. 13 includes a CPU (Central Processing Unit), a RAM (Random Access Memory), a ROM (Read Only Memory) and a storage device. The RAM is used as a work area for the CPU. The ROM stores a system program. The storage device stores a control program. The operation of each component in the substrate cleaning device 1 is controlled by execution of a substrate cleaning program stored in the storage device on the RAM by the CPU.

As shown in FIG. 13, the controller 9 controls the lower chuck drivers 13A, 13B and the upper chuck drivers 14A, 14B in order to mainly receive a substrate W that is carried into the substrate cleaning device 1 and hold the substrate W at a position above the suction holder 21. Further, the controller 9 mainly controls the suction holding driver 22 in order to hold a substrate W by suction by the suction holder 21 and rotate the substrate W held by suction.

Further, the controller 9 mainly controls the base driver 33 in order to move the mobile base 32 with respect to a substrate W held by the upper holding devices 10A, 10B. Further, the controller 9 controls the pin lifting-lowering driver 43 in order to move a substrate W between a height position of the substrate W held by the upper holding devices 10A, 10B and a height position of the substrate W held by the suction holder 21.

Further, the controller 9 controls the lower-surface brush rotation driver 55a, the lower-surface brush lifting-lowering driver 55b, the lower-surface brush movement driver 55c, the lower-surface cleaning liquid supplier 56 and the injection gas supplier 57 in order to clean the lower surface of a substrate W. Further, the controller 9 controls the cup driver 62 in order to receive the cleaning liquid splashed from a substrate W using the cup 61 when the substrate W held by the suction by the suction holder 21 is cleaned.

Further, the controller 9 controls the upper-surface cleaning driver 74 and the upper-surface cleaning fluid supplier 75 in order to clean the upper surface of a substrate W held by suction by the suction holder 21. Further, the controller 9 controls the bevel brush driver 84 in order to clean the outer peripheral end of a substrate W held by suction by the suction holder 21. Further, the controller 9 controls the shutter driver 92 in order to open and close the inlet-outlet port 2x of the unit casing 2 when a substrate W is carried into and carried out from a substrate cleaning device 1.

(2) Operation of Substrate Cleaning Device

FIGS. 14 to 25 are schematic diagrams for explaining one example of the operation of the substrate cleaning device 1 of FIG. 11. In each of FIGS. 14 to 25, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 11, and the side view in the bottom field corresponds to the side view of the substrate cleaning device 1 taken along the line B-B of FIG. 11. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 14 to 25, the cup 61 is indicated by the two-dots and dash lines, and the outer shape of a substrate W is indicated by the thick one-dot and dash lines.

In an initial state before a substrate W is carried into the substrate cleaning device 1, the inlet-outlet port 2x is closed by the shutter 91 of the opening-closing device 90. Further, as shown in FIG. 11, the lower chucks 11A, 11B are maintained in a state where the distance between the lower chucks 11A, 11B is sufficiently larger than the diameter of the substrate W. Further, the upper chucks 12A, 12B are also maintained in a state where the distance between the upper chucks 12A, 12B is sufficiently larger than the diameter of the substrate W. Further, the mobile base 32 of the base device 30 is arranged such that the center of the suction holder 21 is located at the center of the cup 61 in a plan view. Further, the lower-surface cleaning device 50 is arranged in the proximal position on the mobile base 32. Further, the lifting-lowering supporter 54 of the lower-surface cleaning device 50 is in a state where the upper end portion of the brush unit 300 is located farther downwardly than the suction holder 21. Further, the receiving-transferring device 40 is in a state where the plurality of support pins 41 are located farther downwardly than the suction holder 21. Further, in the cup device 60, the cup 61 is in the lower cup position. In the following description, the center position of the cup 61 in a plan view is referred to as a plane reference position rp. Further, the position of the mobile base 32 located on the bottom surface portion 2a when the center of the suction holder 21 is in the plane reference position rp in a plan view is referred to as a first horizontal position.

A substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 14, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 14.

Next, as indicated by the thick solid arrows a2 in FIG. 15, the lower chucks 11A, 11B move closer to each other such that a plurality of support pieces of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces of the lower chucks 11A, 11B. After the hand RH exits, the shutter 91 closes the inlet-outlet port 2x.

Next, as indicated by the thick solid arrows a3 in FIG. 16, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. In this manner, the center of the substrate W held by the upper holding devices 10A, 10B overlaps or substantially overlaps with the plane reference position rp in a plan view. Further, as indicated by the thick solid arrow a4 in FIG. 16, the mobile base 32 is moved forwardly from the first horizontal position, such that suction holder 21 deviates from the plane reference position rp by a predetermined distance and the geometric center 101 (FIG. 3) of the brush unit 300 is located at the plane reference position rp. At this time, the position of the mobile base 32 located on the bottom surface portion 2a is referred to as a second horizontal position.

Next, as indicated by the thick solid arrow a5 in FIG. 17, the lifting-lowering supporter 54 is lifted such that the brush unit 300 comes into contact with the lower-surface center region of the substrate W. Further, as indicated by the thick solid arrow a6 in FIG. 17, the brush unit 300 is rotated (spins) about the axis extending in the up-and-down direction. Thus, contaminants adhering to the lower-surface center region of the substrate W are physically stripped by the brush unit 300.

In the bottom field in FIG. 17, an enlarged side view of a portion in which the brush unit 300 is in contact with the lower surface of the substrate W is shown in a balloon. As shown in the balloon, with the brush unit 300 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the brush unit 300. Thus, the cleaning liquid that has been supplied to the lower surface of the substrate W from the liquid nozzle 52 is guided to the contact portion between the brush unit 300 and the substrate W, whereby contaminants that have been removed from the lower surface of the substrate W by the brush unit 300 are cleaned away by the cleaning liquid. In this manner, in the lower-surface cleaning device 50, the liquid nozzle 52 is attached to the lifting-lowering supporter 54 together with the brush unit 300. Thus, the cleaning liquid can be supplied efficiently to a portion to be cleaned in the lower surface of the substrate W by the brush unit 300. Therefore, the consumption of the cleaning liquid is reduced, and excessive splashing of the cleaning liquid is suppressed.

The rotation speed at which the brush unit 300 is rotated when cleaning the lower surface of the substrate W is maintained at about the speed at which the cleaning liquid supplied to the lower surface of the substrate W from the liquid nozzle 52 is not splashed sidewardly of the brush unit 300.

Here, the upper surface 54u of the lifting-lowering supporter 54 is inclined downwardly in a direction away from the suction holder 21. In this case, in a case where the cleaning liquid including contaminants falls on the lifting-lowering supporter 54 from the lower surface of the substrate W, the cleaning liquid received by the upper surface 54u is guided in a direction away from the suction holder 21.

Further, when the lower surface of the substrate W is cleaned by the brush unit 300, the gas injector 53 injects gas toward the lower surface of the substrate W at a position between the brush unit 300 and the suction holder 21 as indicated by the outlined arrow a52 in the balloon of FIG. 17. In the present embodiment, the gas injector 53 is attached onto the lifting-lowering supporter 54 such that the gas injection port extends in the X direction. In this case, when gas is injected to the lower surface of the substrate W from the gas injector 53, a strip-shaped curtain extending in the X direction is formed between the brush unit 300 and the suction holder 21. Thus, when the lower surface of the substrate W is cleaned by the brush unit 300, the cleaning liquid including contaminants is prevented from being splashed toward the suction holder 21. Thus, when the lower surface of the substrate W is cleaned by the brush unit 300, the cleaning liquid including contaminants is prevented from adhering to the suction holder 21, and the suction surface of the suction holder 21 is maintained clean.

While the gas injector 53 injects gas obliquely upwardly toward the brush unit 300 from the gas injector 53 as indicated by the outlined arrow a52 in the example of FIG. 17, the present invention is not limited to this. The gas injector 53 may inject gas in the Z direction toward the lower surface of the substrate W from the gas injector 53.

Next, in the state of FIG. 17, when the cleaning of the lower-surface center region of the substrate W is completed, the rotation of the brush unit 300 is stopped, and the lifting-lowering supporter 54 is lowered such that the upper end portion of the brush unit 300 is spaced apart from the substrate W by a predetermined distance. Further, discharging of the cleaning liquid from the liquid nozzle 52 to the substrate W is stopped. At this time, the injection of gas from the gas injector 53 to the substrate W continues.

Thereafter, as indicated by the thick solid arrow a7 in FIG. 18, the mobile base 32 is moved rearwardly such that the suction holder 21 is located at the plane reference position rp. That is, the mobile base 32 is moved from the second horizontal position to the first horizontal position. At this time, the injection of gas from the gas injector 53 to the substrate W continues, so that the lower-surface center region of the substrate W is sequentially dried by the gas curtain.

Next, as indicated by the thick solid arrow a8 in FIG. 19, the lifting-lowering supporter 54 is lowered such that the brush unit 300 is located farther downwardly than the suction surface (upper end portion) of the suction holder 21. Further, as indicated by the thick solid arrows a9 in FIG. 19, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 19, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Next, as indicated by the thick solid arrows a11 in FIG. 20, the lower chucks 11A, 11B move away from each other. At this time, the lower chucks 11A, 11B move to positions at which the lower chucks 11A, 11B do not overlap with the substrate W supported by the plurality of support pins 41 in a plan view. Thus, both of the upper holding devices 10A, 10B return to the initial state.

Next, as indicated by the thick solid arrow a12 in FIG. 21, the pin coupling member 42 is lowered such that the upper end portions of the plurality of support pins 41 are located farther downwardly than the suction holder 21. Thus, the substrate W supported on the plurality of support pins 41 is received by the suction holder 21. In this state, the suction holder 21 holds the lower-surface center region of the substrate W by suction. In this manner, the center of the substrate W held by suction by the lower holding device 20 overlaps or substantially overlaps with the plane reference position rp in a plan view. At the same time as the pin coupling member 42 is lowered or after the pin coupling member 42 is lowered, the cup 61 is lifted from the lower cup position to the upper cup position as indicated by the thick solid arrow a13 in FIG. 21.

Next, as indicated by the thick solid arrow a14 in FIG. 22, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 22, the spray nozzle 73 is moved to a position above the substrate W, and the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Thus, as indicated by the thick solid arrow a16 in FIG. 22, the spray nozzle 73 is moved at a position above the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 22, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are cleaned away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the brush unit 300 comes into contact with the lower-surface outer region of the substrate W. Further, as indicated by the thick solid arrow a18 in FIG. 22, the brush unit 300 may be rotated (may spin) about the axis extending in the up-and-down direction. Further, the liquid nozzle 52 discharges the cleaning liquid toward the lower surface of the substrate W, and the gas injector 53 injects the gas toward the lower surface of the substrate W. In this state, as indicated by the thick solid arrow a19 in FIG. 22, the movement supporter 55 advances or retreats between the proximal position and the distal position on the mobile base 32. Thus, the entire lower-surface outer region of the substrate W held by suction and rotated by the suction holder 21 is cleaned by the brush unit 300.

Next, when cleaning of the upper surface, the outer peripheral end and the lower-surface outer region of the substrate W is completed, injection of the fluid mixture from the spray nozzle 73 to the substrate W is stopped. Further, as indicated by the thick solid arrow a20 in FIG. 23, the spray nozzle 73 is moved to a position near one side of the cup 61 (the position in the initial state). Further, as indicated by the thick solid arrow a21 in FIG. 23, the bevel brush 83 is moved to a position near the other side of the cup (the position in the initial state). Further, the rotation of the brush unit 300 is stopped, and the lifting-lowering supporter 54 is lowered such that the upper end portion of the brush unit 300 is spaced apart from the substrate W by a predetermined distance. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Next, as indicated by the thick solid arrow a22 in FIG. 24, the cup 61 is lowered from the upper cup position to the lower cup position. Further, as indicated by the thick solid arrows a23 in FIG. 24, the lower chucks 11A, 11B move closer to each other to a position at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 25, the hand (substrate holder) RH of the substrate transferring robot (not shown) enters the unit casing 2 through the inlet-outlet port 2x. Subsequently, the hand RH receives the substrate W on the suction holder 21 and exits from the inlet-outlet port 2x. After the hand RH exits, the shutter 91 closes the inlet-outlet port 2x.

(3) Effects

In the substrate cleaning device 1 according to the present embodiment, the lower surface of the substrate W held by the upper holding devices 10A, 10B or the lower holding device 20 is cleaned by the lower-surface brush 100 according to the first or second embodiment. Here, when the lower-surface outer region of the substrate W is cleaned, the lower-surface brush 100 is moved to the first horizontal positions. When the lower-surface center region of the substrate W is cleaned, the lower-surface brush 100 is moved to the second horizontal positions. When the lower-surface outer region of the substrate W is cleaned, the substrate W is rotated. Thus, the entire lower surface of the substrate W can be cleaned efficiently.

[4] Correspondences between Constituent Elements in Claims and Parts in Preferred Embodiments In the following paragraphs, non-limiting examples of correspondences between various elements recited in the claims below and those described above with respect to various preferred embodiments of the present disclosure are explained.

In the above-mentioned embodiment, the substrate W is an example of a substrate, the lower-surface brush 100 is an example of a lower-surface brush, the base portion 110 is an example of a base portion, and the geometric center 101 is an example of a geometric center. The cleaning portion 120 is an example of a first cleaning portion, the cleaning portion 130 or the cleaning portion 140 is an example of a second cleaning portion, the through hole 113 is an example of a through hole, the inclined portion 220 is an example of an inclined portion, and the brush base 200 is an example of a brush base. The upper holding devices 10A, 10A or the lower holding device 20 is an example of a substrate holder, the substrate cleaning device 1 is an example of a substrate cleaning device, the base driver 33 is an example of a movement device, and the lower-surface brush rotation driver 55a is an example of a rotation driving device.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

I claim:

1. A lower-surface brush used to clean a first lower surface of a substrate, comprising:
    a base portion having a first upper surface;
    a first cleaning portion that is provided on the first upper surface of the base portion to project upwardly from the first upper surface of the base portion and extend in one direction through a geometric center of the base portion in a plan view; and
    a second cleaning portion provided on the first upper surface of the base portion to project upwardly from the first upper surface of the base portion and extend along an outer edge of the base portion,
    wherein the base portion on which the first cleaning portion is provided and the base portion on which the second cleaning portion is provided are a common member.

2. The lower-surface brush according to claim 1, wherein a through hole through which liquid is dischargeable is formed in the base portion to extend in an up-and-down direction.

3. The lower-surface brush according to claim 1, wherein the base portion has an outer shape that is circular, oblong or oval in the plan view, and
    the first cleaning portion is provided to extend between two points that are located farthest away from each other in an outer edge of the base portion in the plan view.

4. The lower-surface brush according to claim 3, wherein a length between the two points of the base portion is larger than ⅓ and smaller than ½, of the diameter of the substrate in the plan view.

5. A brush base having:
    a second upper surface to which the base portion of the lower-surface brush according to claim 1 is connectable; and
    a second lower surface opposite to the second upper surface, wherein
    an inclined portion that is inclined outwardly and downwardly is formed in a peripheral region of the second lower surface.

6. A substrate cleaning device comprising:
    a substrate holder that holds a substrate; and
    the lower-surface brush according to claim 1 that cleans the first lower surface of the substrate held by the substrate holder.

7. The substrate cleaning device according to claim 6, further comprising a movement device that moves the lower-surface brush between a first horizontal position at which a lower-surface outer region surrounding a lower-surface center region of the substrate is cleanable, and a second horizontal position at which the lower-surface center region of the substrate is cleanable.

8. The substrate cleaning device according to claim 7, wherein
    the substrate holder rotates the substrate at least when the lower-surface outer region of the substrate is cleaned by the lower-surface brush.

9. The substrate cleaning device according to claim 6, further comprising a rotation driving device that is capable of rotating the lower-surface brush about a vertical axis extending through the geometric center of the base portion.

10. A lower-surface brush used to clean a first lower surface of a substrate, comprising:
    a base portion having a first upper surface;
    a first cleaning portion provided on the first upper surface of the base portion to project upwardly from the first upper surface of the base portion and extend in one direction through a geometric center of the base portion in a plan view; and
    one pair or a plurality of pairs of second cleaning portions provided on the first upper surface of the base portion to project upwardly from the first upper surface of the base portion and be opposite to each other with the first cleaning portion interposed therebetween,
    wherein the base portion on which the first cleaning portion is provided and the base portion on which the second cleaning portion is provided are a common member.

11. The lower-surface brush according to claim 10, being configured such that liquid is dischargeable outwardly from a peripheral edge of the base portion through spaces between the first cleaning portion and the second cleaning portion.

* * * * *